United States Patent
Karda et al.

(10) Patent No.: US 12,213,321 B2
(45) Date of Patent: Jan. 28, 2025

(54) MEMORY DEVICE HAVING 2-TRANSISTOR VERTICAL MEMORY CELL AND CONDUCTIVE SHIELD STRUCTURE

(71) Applicant: Micron Technology, Inc., Boise, ID (US)

(72) Inventors: Kamal M. Karda, Boise, ID (US); Richard E. Fackenthal, Carmichael, CA (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 539 days.

(21) Appl. No.: 17/515,065

(22) Filed: Oct. 29, 2021

(65) Prior Publication Data
US 2023/0138322 A1 May 4, 2023

(51) Int. Cl.
  *H10B 43/50* (2023.01)
  *H01L 21/28* (2006.01)
  *H01L 29/10* (2006.01)

(52) U.S. Cl.
  CPC ......... *H10B 43/50* (2023.02); *H01L 29/1062* (2013.01); *H01L 29/40117* (2019.08)

(58) Field of Classification Search
  CPC ..... H10B 43/50; H10B 12/00; H01L 29/1062; H01L 29/40117; G11C 11/405
  See application file for complete search history.

(56) References Cited

U.S. PATENT DOCUMENTS

| 10,803,948 | B2 * | 10/2020 | Fayrushin | ............... G11C 16/24 |
| 2019/0326292 | A1 * | 10/2019 | Mathew | ............... H10B 12/395 |
| 2020/0211602 | A1 * | 7/2020 | Karda | ................. H01L 29/7889 |

(Continued)

FOREIGN PATENT DOCUMENTS

JP          H05110016         4/1993

OTHER PUBLICATIONS

"International Application Serial No. PCT US2022 047720, International Search Report mailed Feb. 27, 2023", 3 pgs.

(Continued)

*Primary Examiner* — Shahed Ahmed
*Assistant Examiner* — Khatib A Rahman
(74) *Attorney, Agent, or Firm* — Schwegman Lundberg & Woessner, P.A.

(57) ABSTRACT

Some embodiments include apparatuses and methods forming the apparatuses. One of the apparatuses includes a first memory cell including a first transistor including a first channel region and a first charge storage structure, and a second transistor including a second channel region formed over the charge storage structure; a second memory cell adjacent the first memory cell, the second memory cell including a third transistor including a third channel region and a second charge storage structure, and a fourth transistor including a fourth channel region formed over the second charge storage structure; a first access line adjacent a side of the first memory cell; a second access line adjacent a side of the second memory cell; a first dielectric material adjacent the first channel region; a second dielectric material adjacent the third channel region; and a conductive structure between the first and second dielectric materials and adjacent the first and second dielectric materials.

14 Claims, 27 Drawing Sheets

(56) References Cited

U.S. PATENT DOCUMENTS

| | | | |
|---|---|---|---|
| 2020/0211629 A1* | 7/2020 | Karda | G11C 11/403 |
| 2020/0357454 A1* | 11/2020 | Derner | H01L 28/90 |
| 2021/0066196 A1 | 3/2021 | Karda et al. | |
| 2021/0066301 A1 | 3/2021 | Karda et al. | |
| 2021/0066302 A1 | 3/2021 | Karda et al. | |

OTHER PUBLICATIONS

"International Application Serial No. PCT US2022 047720, Written Opinion mailed Feb. 27, 2023", 4 pgs.

\* cited by examiner

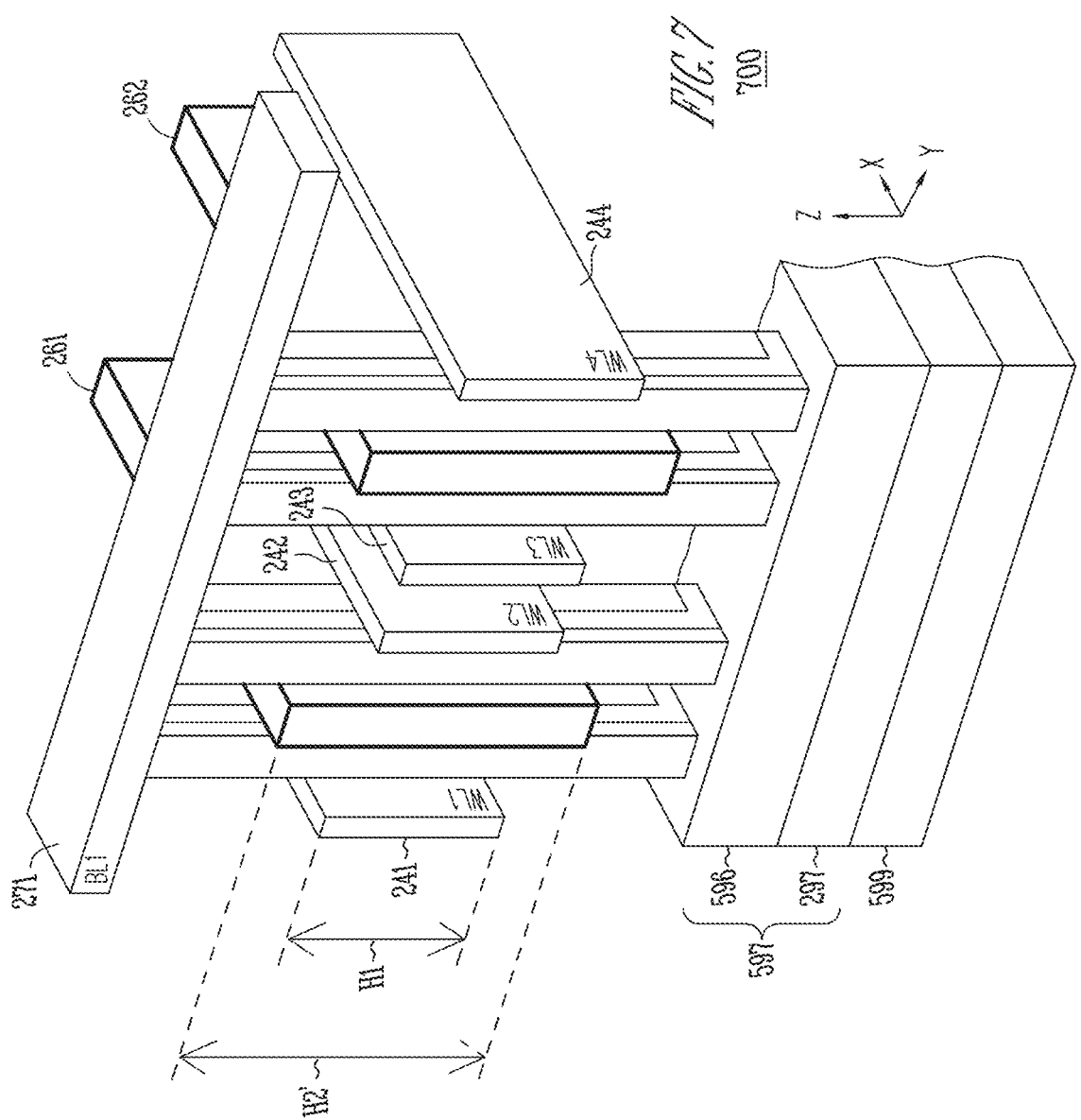

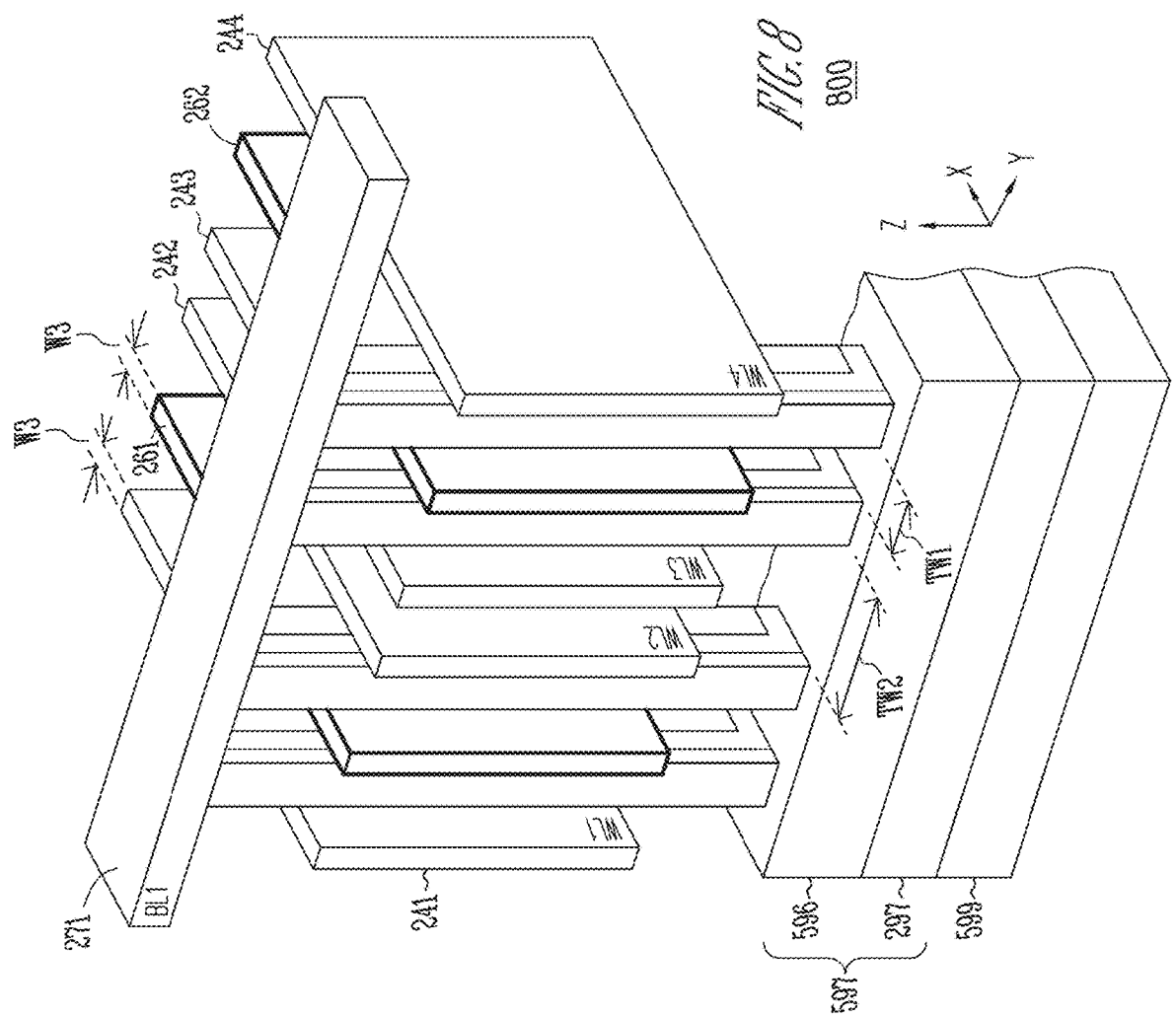

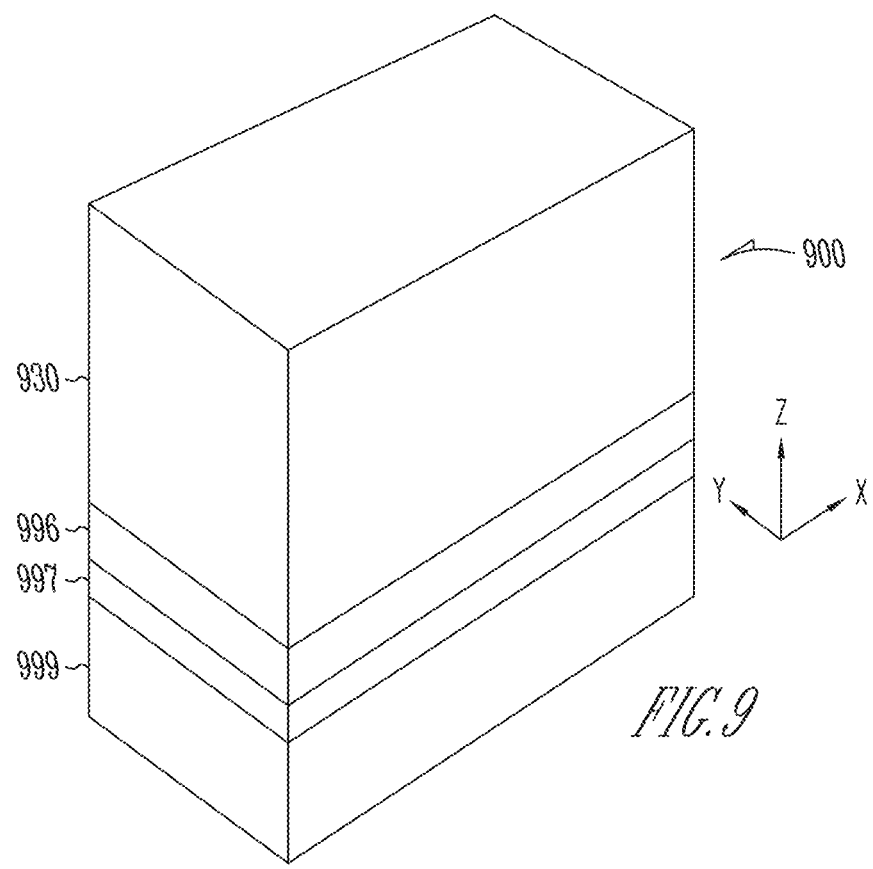

MEMORY DEVICE HAVING 2-TRANSISTOR VERTICAL MEMORY CELL AND CONDUCTIVE SHIELD STRUCTURE

BACKGROUND

Memory devices are widely used in computers and many other electronic items to store information. Memory devices are generally categorized into two types: volatile memory devices and non-volatile memory devices. A memory device usually has numerous memory cells in which to store information. In a volatile memory device, information stored in the memory cells is lost if power supply is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Further, increased device storage density for a given area may cause excessive capacitive coupling between elements of adjacent memory cells. Moreover, the structure and operation of some conventional memory cells require a transistor in the memory cell to have a relatively high threshold voltage. Unlike some conventional memory devices, the memory devices described herein include features that can overcome challenges faced by conventional techniques.

BRIEF DESCRIPTION OF THE DRAWINGS

FIG. 7 shows an alternative structure of the memory device of FIG. 2 through FIG. 6D including access lines and conductive shield structures having different heights, according to some embodiments described herein.

FIG. 8 shows an alternative structure of the memory device of FIG. 2 through FIG. 6D including access lines and conductive shield structures having different thickness, according to some embodiments described herein.

FIG. 9 through FIG. 22C show processes of forming a memory device, according to some embodiments described herein.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size (e.g., footprint) of the memory device to be relatively smaller than the size (e.g., footprint) of similar conventional memory devices. The described memory device can include a single access line (e.g., word line) to control two transistors of a corresponding memory cell. This can lead to reduced power dissipation and improved processing. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. The described memory device can include a conductive shield structure adjacent a side of the memory cell. The conductive shield structure can suppress or prevent potential leakage of current in the memory cell. This can improve retention of information stored in the memory cell. Other improvements and benefits of the described memory device and its variations are discussed below with reference to FIG. 1 through FIG. 23C.

Figure 1:
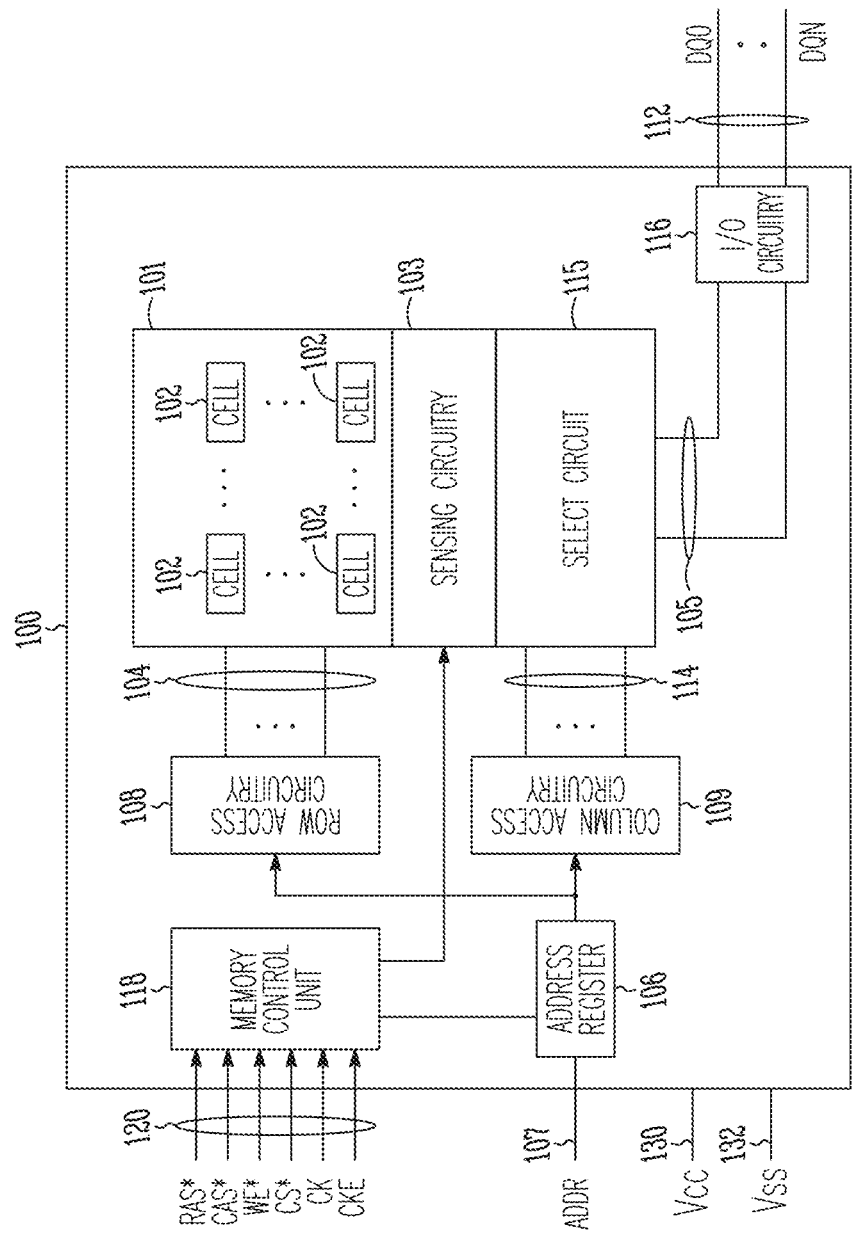
FIG. 1 shows a block diagram of an apparatus in the form of a memory device including memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 23C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102 and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 23C.

Figure 2:
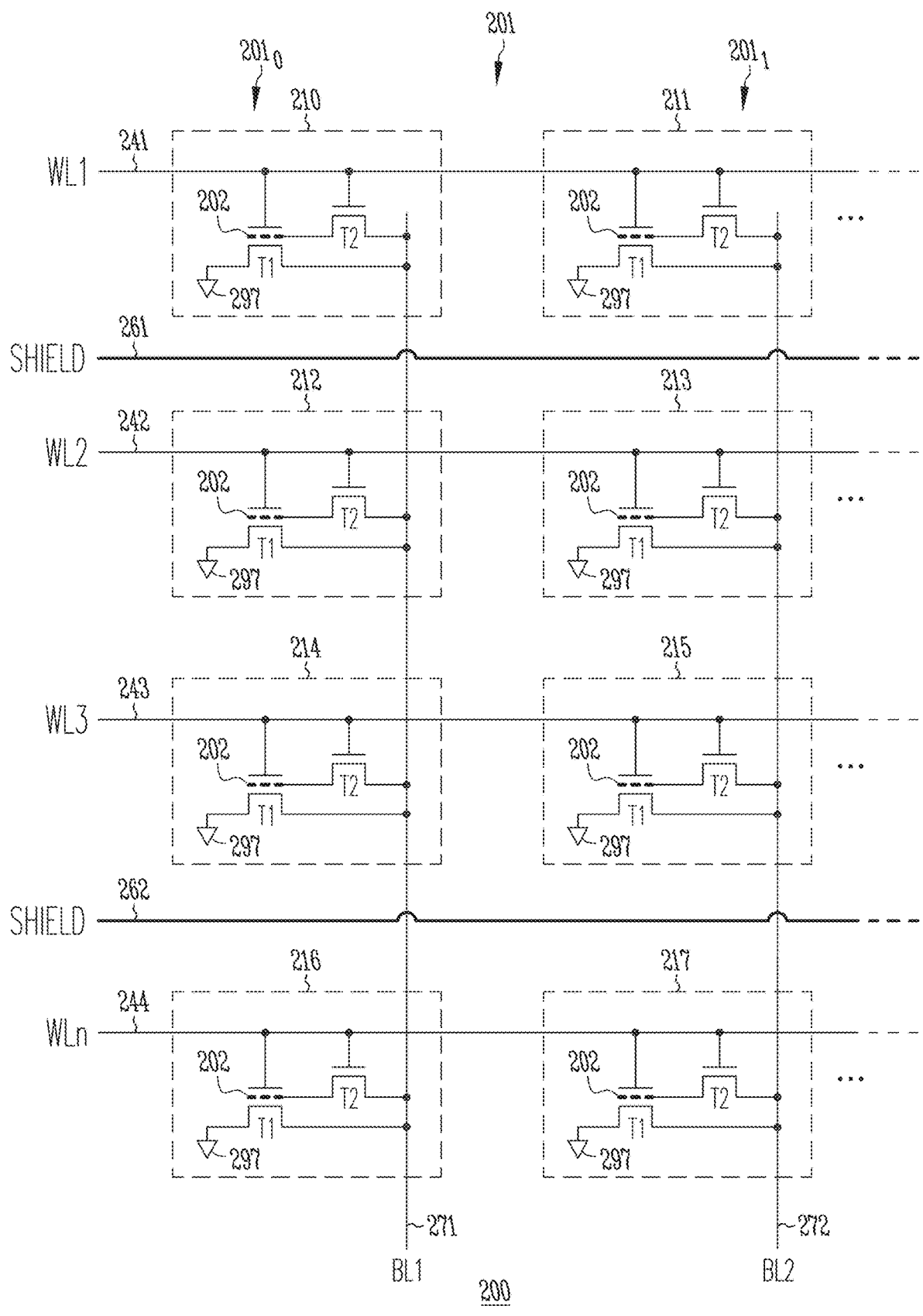
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 217, which are volatile memory cells (e.g., DRAM cells). For simplicity, similar or identical elements among memory cells 210 through 217 are given the same labels.

Each of memory cells 210 through 217 can include two transistors T1 and T2. Thus, each of memory cells 210 through 217 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor. Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 217 can include a charge storage structure 202, which can include the floating gate of transistor T1. Charge storage structure 202 can form the memory element of a respective memory cell among memory cells 210 through 217. Charge storage structure 202 can store charge. The value (e.g., "0" or "1") of information stored in a particular memory cell among memory cells 210 through 217 can be based on the amount of charge in charge storage structure 202 of that particular memory cell. For example, the value of information stored in a particular memory cell among memory cells 210 through 217 can be "0" or "1" (if each memory cell is configured as a single-bit memory cell) or "00", "01", "10", "11" (or other multi-bit values) if each memory cell is configured as a multi-bit memory cell.

As shown in FIG. 2, transistor T2 (e.g., the channel region of transistor T2) of a particular memory cell among memory cells 210 through 217 can be electrically coupled to (e.g., directly coupled to (contact)) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 271 or 272) and charge storage structure 202 of a particular memory cell through transistor T2 (e.g., through the channel region of transistor T2) of the particular memory cell.

Memory cells 210 through 217 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, 214, and 216, and memory cell group $201_1$ can include memory cells 211, 213, 215, and 217. FIG. 2 shows four memory cells in each of memory cell groups $201_0$ and $201_1$ as an example. The number of memory cells in memory cell groups $201_0$ and $201_1$ can be different from four.

Memory device 200 can perform a write operation to store information in memory cells 210 through 217 and a read operation to read (e.g., sense) information from memory cells 210 through 217. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor TL. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, 243, and 244 that can carry respective signals (e.g., word line signals) WL1, WL2, LW3, and WLn. Access lines 241, 242, 243, and 244 can be used to access both memory cell groups $201_0$ and $201_1$. In the physical structure of memory device 200, each of access lines 241, 242, 243, and 244 can be structured as (can be formed from) a conductive line (e.g., a single conductive line).

Access lines 241, 242, 243, and 244 form control gates for respective memory cells (e.g., memory cells 210 through 217 in FIG. 2) of memory device 200 to control access to the memory cells during an operation (e.g., read or write operation) of memory device 200.

Memory device 200 can include conductive shield structures 261 and 262, which are symbolically shown in FIG. 2 as lines (conductive lines). In the physical structure of memory device 200, each of conductive shield structures 261 and 262 can be structured as conductive lines (e.g., conductive regions) that can have respective lengths parallel to the lengths of access lines 241, 242, 243, and 244.

Conductive shield structures 261 and 262 are not access lines (e.g., not word lines) of memory device 200. The operations and functions of conductive shield structures 261 and 262 are unlike those of access lines 241, 242, 243, and 244. In a read or write operation, memory device 200 uses access lines 241, 242, 243, and 244 as selected and unselected access lines to control (e.g., turn on or turn off) transistors T1 and T2 of selected memory cells and unselected memory cells. However, in a read or write operation of memory device 200, each of conductive shield structures 261 and 262 is neither an access line (e.g., selected access line) for a selected memory cell (or selected memory cells) nor an access line (e.g., unselected access line) for unselected memory cells of memory device 200. The conductive shield structures (e.g., conductive shield structures 261 and 262) of memory device 200 allow relaxing of the threshold voltage of transistor T2, improve retention of the memory cells, and other improvements and benefits described below.

As shown in FIG. 2, conductive shield structures 261 and 262 can be applied with a signal SHIELD. Signal SHIELD can be provided with a voltage during read and write operations of memory device 200. The voltage applied to signal SHIELD during a read operation can be the same as (or can be different from) the voltage applied to signal SHIELD during a write operation. Signal SHIELD can be also provided with a voltage during a non-read operation (when a read operation is not performed) and during a non-write operation (when a write operation is not performed). Such non-read and non-write operations can occur in (e.g., can include) an idle mode, a standby mode, or in other inactive modes of memory device 200. Conductive shield structures 261 and 262 can be biased at a constant bias (e.g., a constant voltage can be applied to signal SHIELD during read and write operations and during non-read and non-write operations (e.g., in inactive modes).

In FIG. 2, access lines 241, 242, 243, and 244 can be selectively activated (e.g., activated one at a time) during an operation (e.g., read or write operation) of memory device 200 to access a selected memory cell (or selected memory cells) among memory cells 210 through 217. A selected memory cell can be referred to as a target memory cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 271 or 272) can be used to access a selected memory cell (e.g., during a read operation) to read information from the selected memory cell. This may also simplify the structure, operation, or both of memory device 200 in comparison with conventional memory devices that use multiple data lines to access a selected memory cell.

In memory device 200, the gate (not labeled in FIG. 2) of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the physical structure of memory device 200, four different portions of a conductive material (e.g., four different portions of a continuous piece of metal or polysilicon) that forms access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (e.g., four different portions of a continuous piece of metal or polysilicon) that forms access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (e.g., four different portions of a continuous piece of metal or polysilicon) that forms access line 243 can form the gates (e.g., four gates) of transistors T1 and T2 of memory cell 214 and the gates of transistors T1 and T2 of memory cell 215, respectively.

The gate of each of transistors T1 and T2 of memory cell 216 can be part of access line 244. The gate of each of transistors T1 and T2 of memory cell 217 can be part of access line 244. For example, in the structure of memory device 200, four different portions of a conductive material (e.g., four different portions of a continuous piece of metal or polysilicon) that forms access line 244 can form the gates (e.g., four gates) of transistors T1 and T2 of memory cell 216 and the gates of transistors T1 and T2 of memory cell 217, respectively.

In this description, a material can include a single material or a combination of multiple materials. A conductive material can include a single conductive material or combination multiple conductive materials.

Memory device 200 can include data lines (e.g., bit lines) 271 and 272 that can carry respective signals (e.g., bit line signals) BL1 and BL2. During a read operation, memory device 200 can use data line 271 to obtain information read (e.g., sensed) from a selected memory cell of memory cell group $206_0$, and data line 272 to read information from a selected memory cell of memory cell group $201_1$. During a write operation, memory device 200 can use data line 271 to provide information to be stored in a selected memory cell of memory cell group $201_0$, and data line 272 to provide information to be stored in a selected memory cell of memory cell group $201_1$.

Memory device 200 can include a ground connection (e.g., ground plate) 297 coupled to each of memory cells 210 through 217. Ground connection 297 can be structured from a conductive plate (e.g., a layer of conductive material) that can be coupled to a ground terminal of memory device 200.

As an example (e.g., like FIG. 6D), ground connection 297 can be part of a common conductive structure (e.g., a common conductive plate) that can be formed on a level of memory device 200 that is under the memory cells (e.g., memory cells 210 through 217) of memory device 200. In this example, the elements (e.g., part of transistors T1 and T2 or the entire transistors T1 and T2) of each of the memory cells (e.g., memory cells 210 through 217) of memory device 200 can be formed (e.g., formed vertically) over the common conductive structure (e.g., a common conductive plate) and electrically coupled to the common conductive structure.

In another example (e.g., like FIG. 6E), ground connection 297 can be part of separate conductive structures (e.g., separate conductive strips) that can be formed on a level of memory device 200 that is under the memory cells (e.g., memory cells 210 through 217) of memory device 200. In this example, the elements (e.g., part of transistors T1 and T2) of each of the memory cells (e.g., memory cells 210 through 217) of memory device 200 can be formed over (e.g., formed vertically) respective conductive structures (e.g., respective conductive strips) among the separate conductive structures (e.g., separate conductive strips) and electrically coupled to the respective conductive structures.

As shown in FIG. 2, transistor T1 (e.g., the channel region of transistor T1) of a particular memory cell among memory cells 210 through 217 can be electrically coupled to (e.g., directly coupled to) ground connection 297 and electrically coupled to (e.g., directly coupled to) a respective data line (e.g., data line 271 or 272). Thus, a circuit path (e.g., current path) can be formed between a respective data line (e.g., data line 271 or 272) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, 214, or 216) can include a current path (e.g., read current path) through a channel region of transistor T1 of that particular memory cell, data line 271, and ground connection 297. In memory cell group $201_1$, a read path of a particular memory cell (e.g., memory cell 211, 213, 215, s) can include a current path (e.g., read current path) through a channel region of transistor T1 of that particular memory cell, data line 272, and ground connection 297. In the example where transistor T1 is a PFET (e.g., a PMOS), the current in the read path (e.g., during a read operation) can include a hole conduction (e.g., hole conduction in the direction from data line 271 to ground connection 297 through the channel region (e.g., p-channel region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 271. In memory cell group $201_1$, a write path of a particular memory cell (e.g., memory cell 211, 213, 215, or 217) can include transistor T2 (e.g., can include a write current path through a channel region of transistor T2) of that particular memory cell and data line 272. In the example where transistor T2 is an NFET (e.g., NMOS), the current in a write path (e.g., during a write operation) can include an electron conduction (e.g., electron conduction in the direction from data line 271 to charge storage structure 202) through the channel region (e.g., n-channel region) of transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1," where Vt1 for state "0"<0V (or alternatively Vt1 for state "0"=0V). Vt1 for state "1">0V, and Vt1<Vt2.

In another alternative structure, transistors T1 and T2 can be formed (e.g., engineered) such that Vt1 for state "0"<Vt1 for state "1," where Vt1 for state "0"=0V (or alternatively Vt1 for state "0">0V), and Vt1<Vt2.

During a read operation of memory device 200, only one memory cell of the same memory cell group can be selected one at a time to read information from the selected memory cell. For example, memory cells 210, 212, 214, and 216 of memory cell group $201_0$ can be selected one at a time during a read operation to read information from the selected memory cell (e.g., one of memory cells 210, 212, 214, and 216 in this example). In another example, memory cells 211, 213, 215, and 217 of memory cell group $201_1$ can be selected one at a time during a read operation to read information from the selected memory cell (e.g., one of memory cells 211, 213, 215, and 217 in this example).

During a read operation, memory cells of different memory cell groups (e.g., memory cell groups $201_0$ and $201_1$) that share the same access line (e.g., access line 241, 242, 243, or 244) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215. Memory cells 216 and 217 can be concurrently selected during a read operation to read (e.g., concurrently read) information from memory cells 216 and 217.

The value of information read from the selected memory cell of memory cell group $201_0$ during a read operation can be determined based on the value of a current detected (e.g., sensed) from a read path (described above) that includes data line 271, transistor T1 of the selected memory cell (e.g., memory cell 210, 212, 214, or 216), and ground connection 297. The value of information read from the selected memory cell of memory cell group $201_1$ during a read operation can be determined based on the value of a current detected (e.g., sensed) from a read path that includes data line 272, transistor T1 of the selected memory cell (e.g., memory cell 211, 213, 215, or 217), and ground connection 297.

Memory device 200 can include detection circuitry (not shown) that can operate during a read operation to detect (e.g., sense) a current (e.g., current I1, not shown) on a read path that includes data line 271 and detect a current (e.g., current I2, not shown) on a read path that includes data line 272. The value of the detected current can be based on the value of information stored in the selected memory cell. For example, depending on the value of information stored in the selected memory cell of memory cell group $201_0$, the value of the detected current (e.g., the value of current I1) on data line 271 can be zero or greater than zero. Similarly, depending on the value of information stored in the selected memory cell of memory cell group $201_1$, the value of the detected current (e.g., the value of current I2) on data line 272 can be zero or greater than zero. Memory device 200 can include circuitry (not shown) to translate the value of a detected current into the value (e.g., "0," "1," or a combination of multi-bit values) of information stored in the selected memory cell.

During a write operation of memory device 200, only one memory cell of the same memory cell group can be selected at a time to store information in the selected memory cell. For example, memory cells 210, 212, 214, and 216 of memory cell group $201_0$ can be selected one at a time during a write operation to store information in the selected memory cell (e.g., one of memory cell 210, 212, 214, and 216 in this example). In another example, memory cells 211, 213, 215, and 217 of memory cell group $201_1$ can be selected one at a time during a write operation to store information in the selected memory cell (e.g., one of memory cell 211, 213, 215, and 217 in this example).

During a write operation, memory cells of different memory cell groups (e.g., memory cell groups $201_0$ and $201_1$) that share the same access line (e.g., access line 241, 242, 243, or 244) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215. Memory cells 216 and 217 can be concurrently selected during a write operation to store (e.g., concurrently store) information in memory cells 216 and 217.

Information to be stored in a selected memory cell of memory cell group $201_0$ during a write operation can be provided through a write path (described above) that includes data line 271 and transistor T2 of the selected memory cell (e.g., memory cell 210, 212, 214, or 216). Information to be stored in a selected memory cell of memory cell group $201_1$ during a write operation can be provided through a write path (described above) that includes data line 272 and transistor T2 of the selected memory cell (e.g., memory cell 211, 213, 215, or 217). As described above, the value (e.g., binary value) of information stored in a particular memory cell among memory cells 210 through 217 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 271 or 272) coupled to that particular memory cell. For example, a voltage having one value (e.g., 0V) can be applied on data line 271 (e.g., provide 0V to signal BL1) if information to be stored in a selected memory cell among memory cells 210, 212, 214, and 216 has one value (e.g., "0"). In another example, a voltage having another value (e.g., a positive voltage) can be applied on data line 271 (e.g., provide a positive voltage to signal BL1) if information to be stored in a selected memory cell among memory cells 210, 212, 214, and 216 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
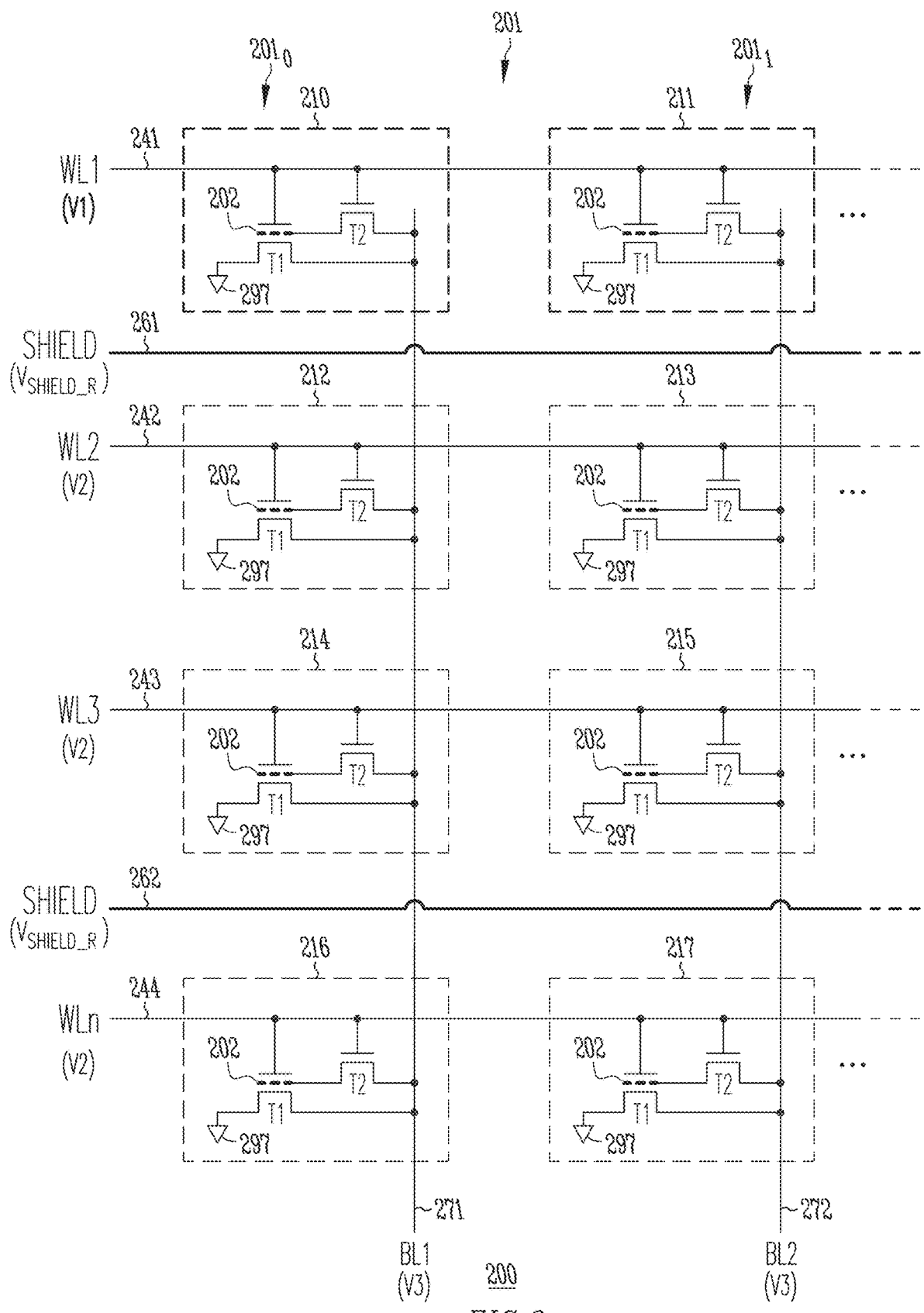
FIG. 3 shows the memory device of FIG. 2, including example voltages used during a read operation of the memory device, according to some embodiments described herein.

FIG. 3 shows memory device 200 of FIG. 2 including example voltages V1, V2, V3, and $V_{SHIELD\_R}$ used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 217 are assumed to be unselected memory cells. This means that memory cells 212 through 217 are not accessed, and information stored in memory cells 212 through 217 is not read while information is read from memory cells 210 and 211 in the example of FIG. 3. In this example, access line 241 can be called a selected access line (e.g., selected word line), which is the access line associated with (e.g., coupled to) selected memory cells (e.g., memory cells 210 and 211 in this example). In this example, access lines 242, 243, and 244 can be called unselected access lines (e.g., unselected word lines), which are the access lines associated with (e.g., coupled to) unselected memory cells (e.g., memory cells 212 through 217 in this example).

In FIG. 3, voltages V1, V2, and V3 can represent different voltages applied to respective access lines 241, 242, 243, and 244 and data lines 271 and 272 during a read operation of memory device 200. Voltage V1 can be applied to the selected access line (e.g., access line 241). In a read operation, Voltage V2 can be applied to the unselected access lines (e.g., access lines 242, 243, and 244).

Voltages V1, V2, and V3 can have different values. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 217 (unselected memory cells in this example) are turned off (e.g., kept off). Voltage V3 can have a value, such that a current (e.g., read current) may be formed on a read path that includes data line 271 and transistor T1 of memory cell 210 and a read path (a separate read path) that includes data line 272 and transistor T1 of memory cell 212. This allows a detection of current on the read paths (e.g., on respective data lines 271 and 272) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 271 and 272 can be translated into the values of information read from memory cells 210 and 211, respectively.

In the read operation shown in FIG. 3, the voltages applied to respective access lines 241, 242, 243, and 244 can cause transistors T1 and T2 of each of memory cells 212 through 217, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 217) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 271 (through transistor T1 of memory cell 210). In this example, transistor T1 of memory cell 211 can also turn on and conduct a current on data line 272 (through transistor T1 of memory cell 211). Memory device 200 can determine the value of information stored in memory cells 210 and 211 based on the value of the currents on data lines 271 and 272, respectively. As described above, memory device 200 can include detection circuitry to measure the value of currents on data lines 271 and 272 during a read operation.

Voltage $V_{SHIELD\_R}$ can have a negative value, zero volts, or a positive value. For example, voltage $V_{SHIELD\_R}$ can have a range from −1V to +1V. Other values can be used. In some operations (e.g., read operations and non-read operations) of memory device 200, using a negative value (or zero volts) for voltage $V_{SHIELD\_R}$ can offer more benefit than using a positive value for voltage $V_{SHIELD\_R}$. For example, voltage $V_{SHIELD\_R}$ having a negative value (or zero volts) applied to conductive shield structure 261 can suppress or prevent potential leakage of current in memory cells that are adjacent conductive shield structure 261 or 262, or both. This can improve retention of information stored in the adjacent memory cells.

Figure 4:
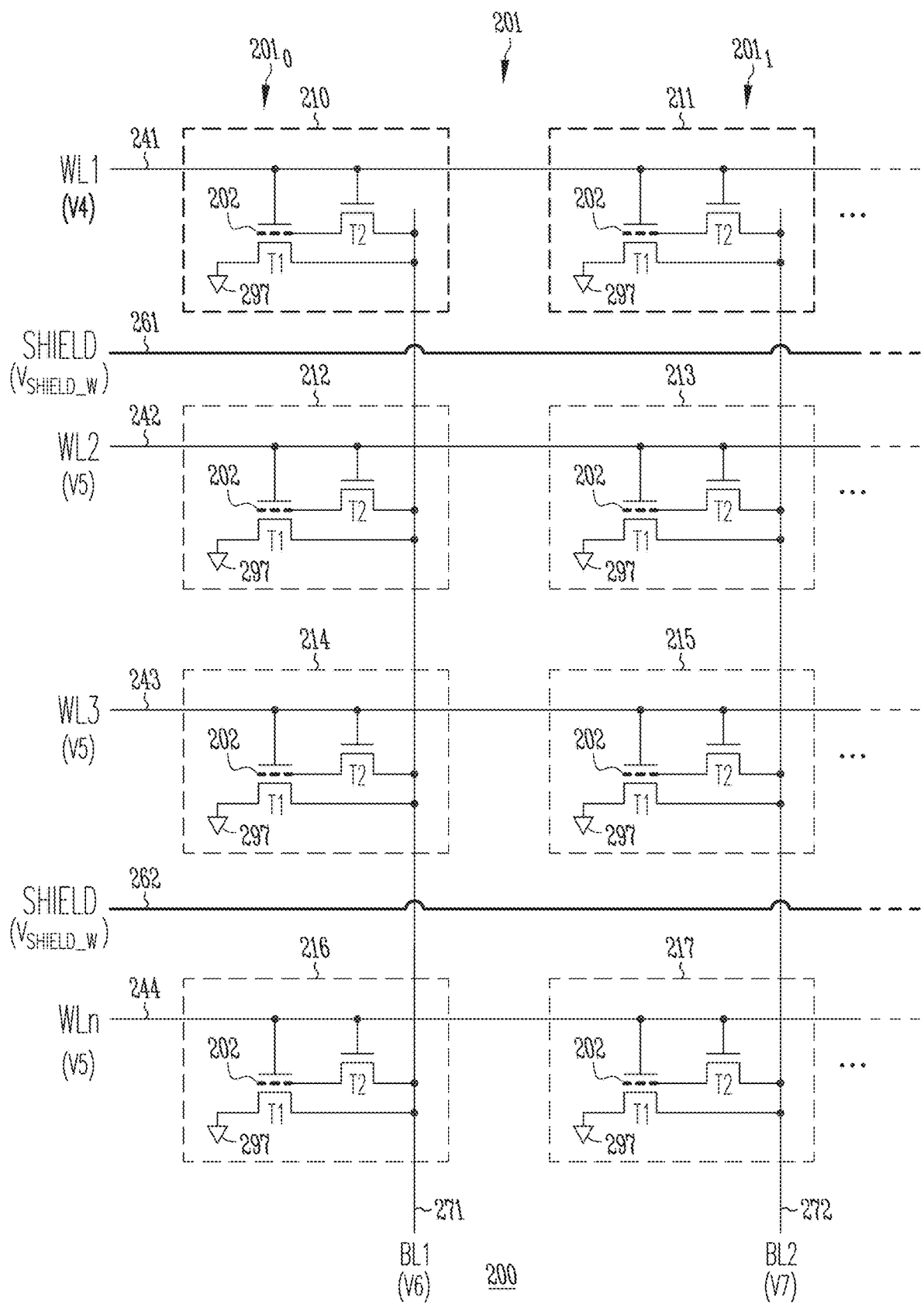
FIG. 4 shows the memory device of FIG. 2, including example voltages used during a write operation of the memory device, according to some embodiments described herein.

FIG. 4 shows memory device 200 of FIG. 2 including example voltages V4, V5, V6, V7, and $V_{SHIELD\_W}$ used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 217 are assumed to be unselected memory cells. This means that memory cells 212 through 217 are not accessed and information is not to be stored in memory cells 212 through 217 while information is stored in memory cells 210 and 211 in the example of FIG. 4.

In FIG. 4, voltages V4. V5. V6, and V7 can represent different voltages applied to respective access lines 241, 242, 243, and 244 and data lines 271 and 272 during a write operation of memory device 200. In a write operation, voltage V4 can be applied to the selected access line (e.g., access line 241). Voltage V5 can be applied to the unselected access lines (e.g., access lines 242, 243, and 244).

Voltages V4, V5. V6, and V7 can have different values. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0". In another example, V6=V7=V+ (e.g., V+ is a positive voltage (e.g., from 1V to 3V)) if information to be stored in each memory cell 210 and 211 is "1".

In another example, the values of voltages V6 and V7 can be different (e.g., V6≠V7) if the memory cells 210 and 211 are to store information having different values. As an example, V6=0V if "0" is to be stored in memory cell 210, and V7=V+ (e.g., V+ is a positive voltage (e.g., from 1V to 3V)) if "1" is to be stored in memory cell 211. As another example, V6=V+ (e.g., V+ is a positive voltage (e.g., from 1V to 3V)) if "1" is to be stored in memory cell 210, and V7=0V if "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 271 or 272) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value (e.g., V5=0V or V5<0V) such that transistors T1 and T2 of each of memory cells 212 through 217 (unselected memory cells, in this example) are turned off (e.g., kept off). Voltage V4 can have a value (e.g., V4>0V) to turn on transistor T2 of each of memory cells 210 and 211 (selected memory cells in this example) and form a write path between charge storage structure 202 of memory cell 210 and data line 271 and a write path between charge storage structure 202 of memory cell 211 and data line 272. A current (e.g., write current) may be formed between charge storage structure 202 of memory cell 210 (selected memory cell) and data line 271. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 272. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Voltage $V_{SHIELD\_W}$ can have a negative value, zero volts, or a positive value. For example, voltage $V_{SHIELD\_R}$ can have a range from −1V to +1V. Other values can be used. Voltage $V_{SHIELD\_W}$ can have a value that is the same as (equal) or different from the value of voltage $V_{SHIELD\_R}$. In some operations (e.g., write operations and non-write operations) of memory device 200, using a negative value (or zero volts) for voltage $V_{SHIELD\_W}$ can offer more benefit (e.g., improved retention, as described above) than using a positive value for voltage $V_{SHIELD\_R}$.

FIG. 5A, FIG. 5B, and FIG. 6A through FIG. 6D show different views of a structure of memory device 200 of FIG. 2 with respect to the X, Y, and Z directions, according to some embodiments described herein. FIG. 6E shows a memory device 200E, which is an alternative structure of memory device 200 of FIG. 6D. For simplicity, cross-sectional lines (e.g., hatch lines) are omitted from most of the elements shown in FIG. 5A through FIG. 6E and other figures (e.g., FIG. 8A through FIG. 23C) in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

Figure 5B:
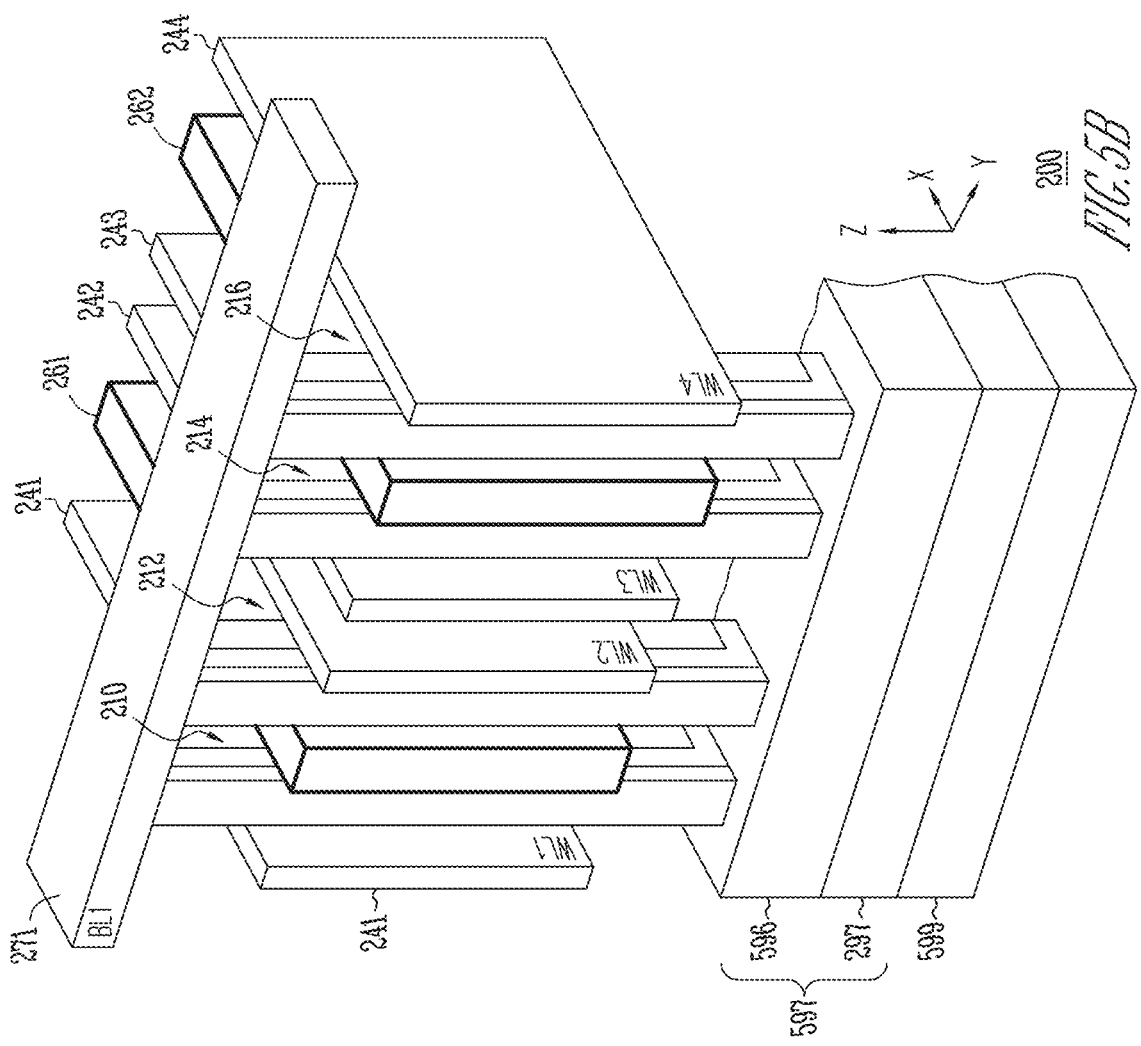
FIG. 5A, FIG. 5B, and FIG. 6A through FIG. 6D show different views of a structure of the memory device of FIG. 2 including access lines and conductive shield structures, according to some embodiments described herein.
Figure 5A:
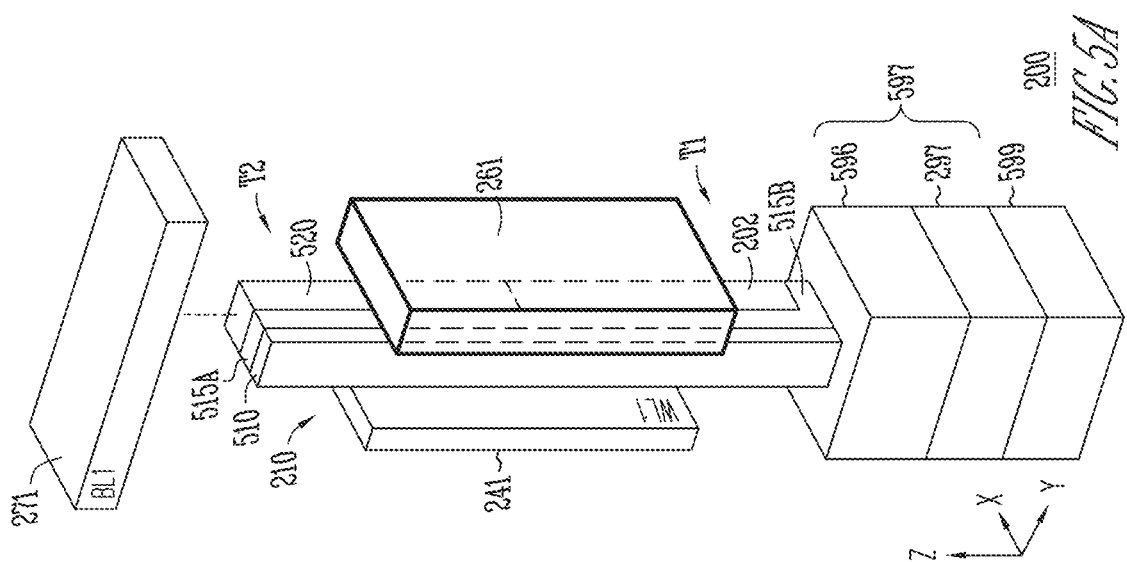
Figure 6A:
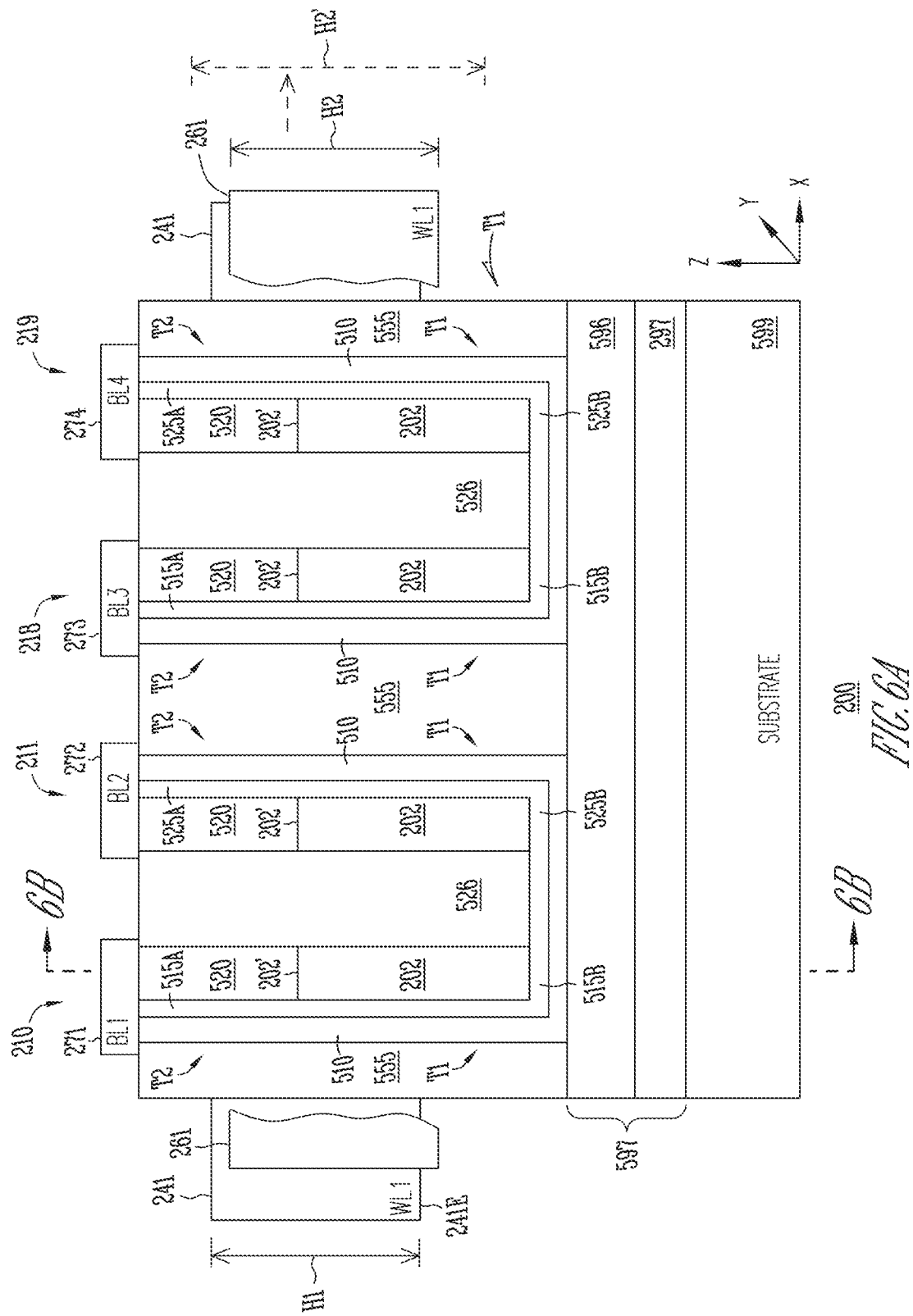
Figure 6B:
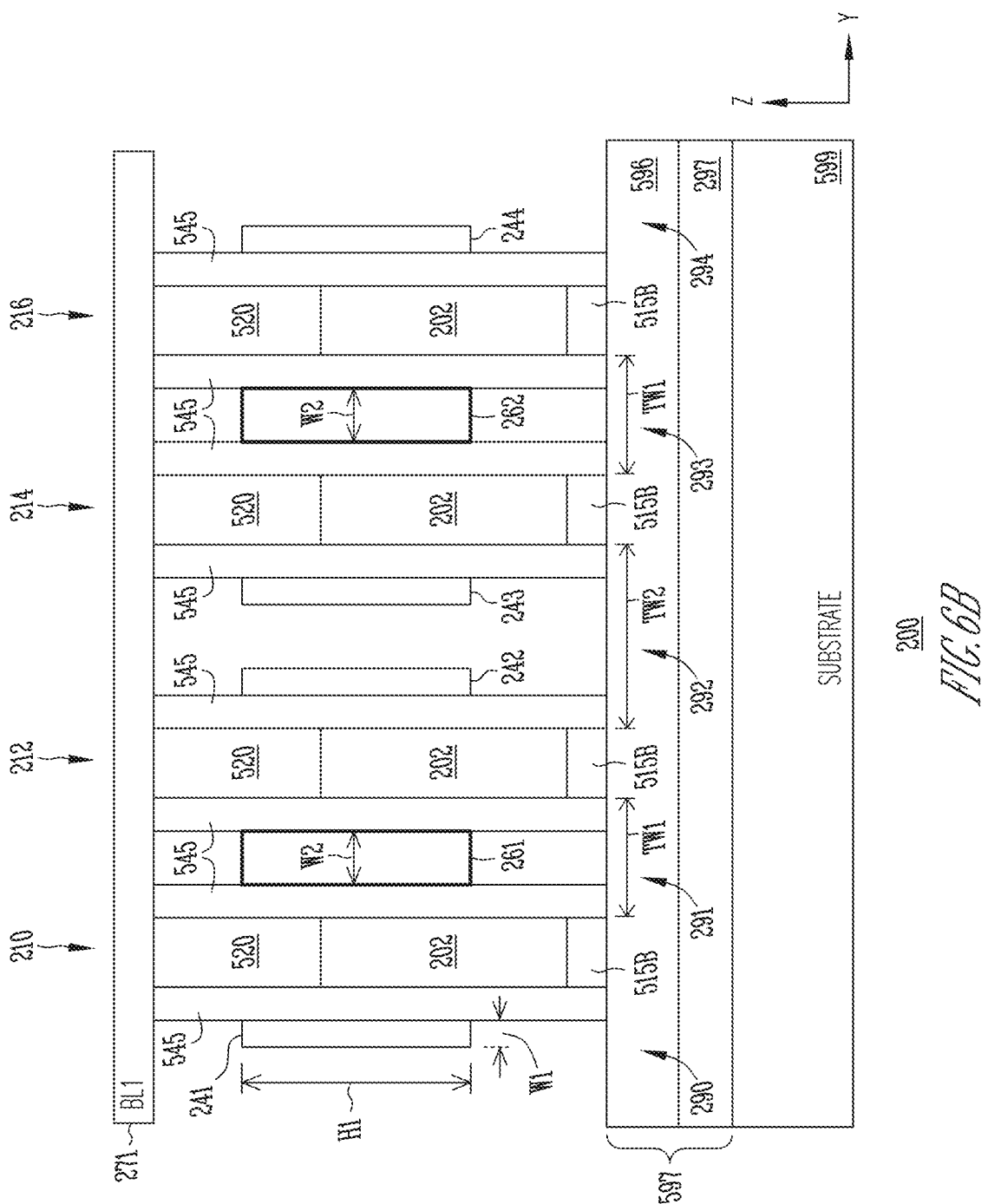
Figure 6C:
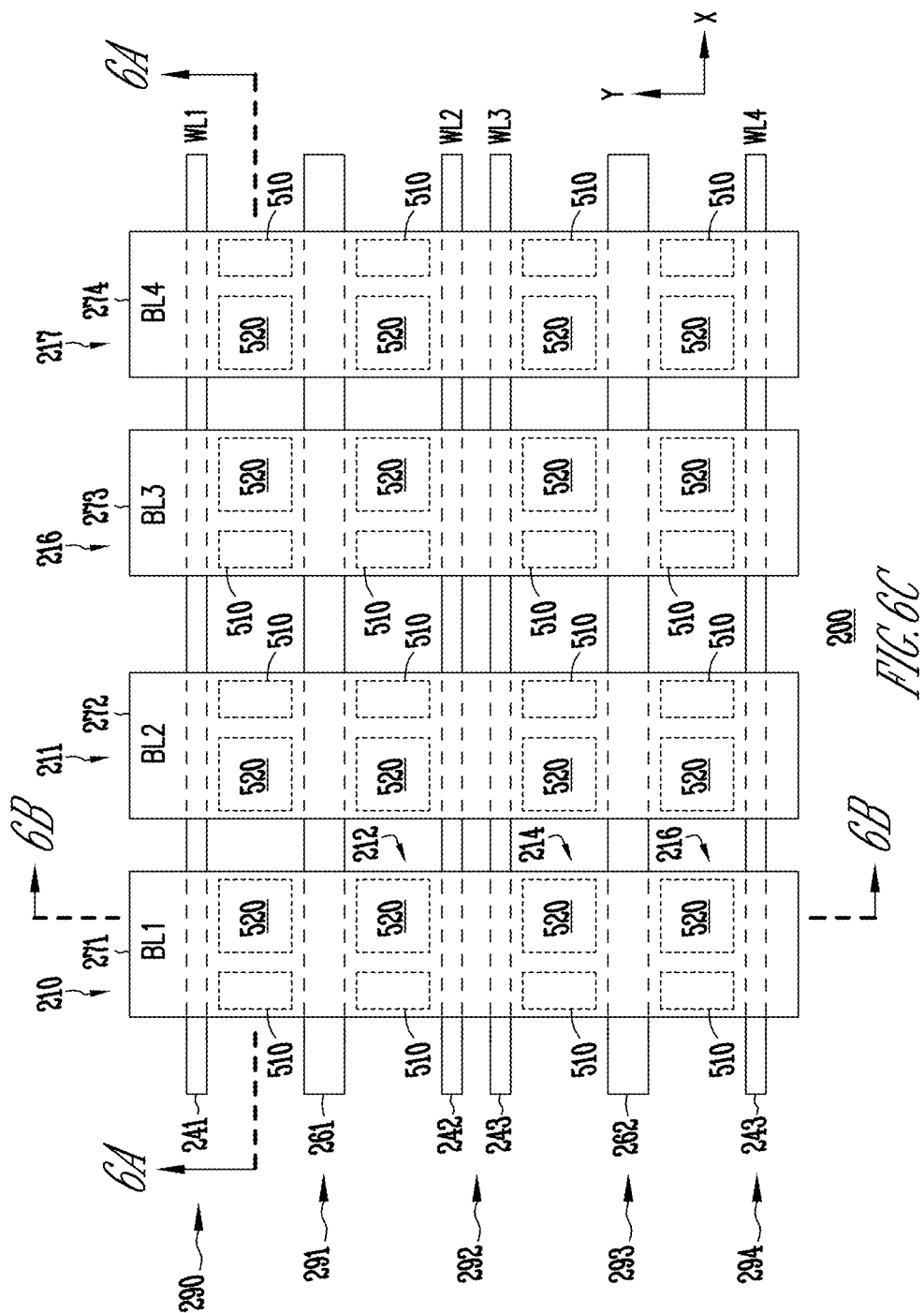
Figure 6D:
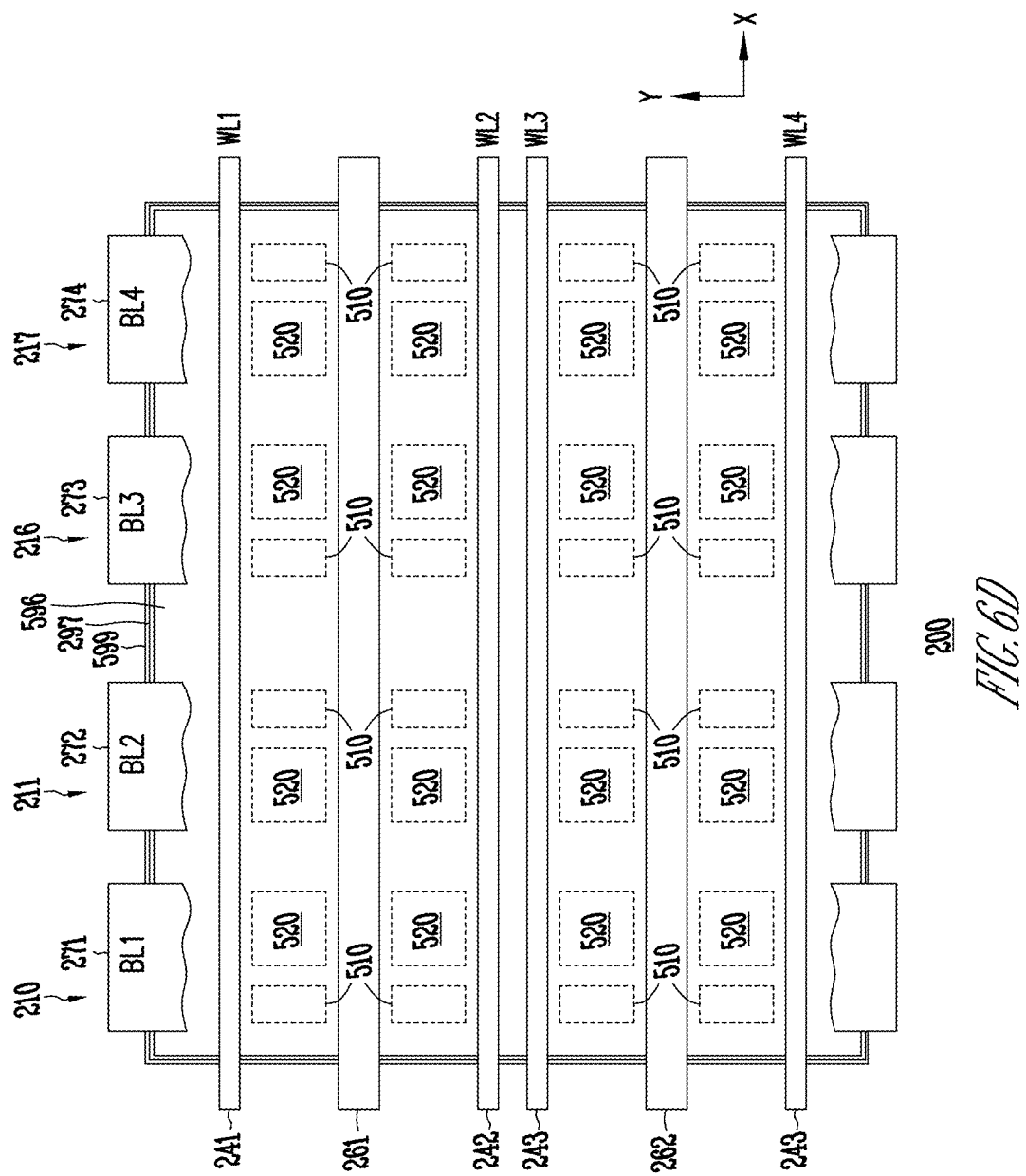
Figure 6E:
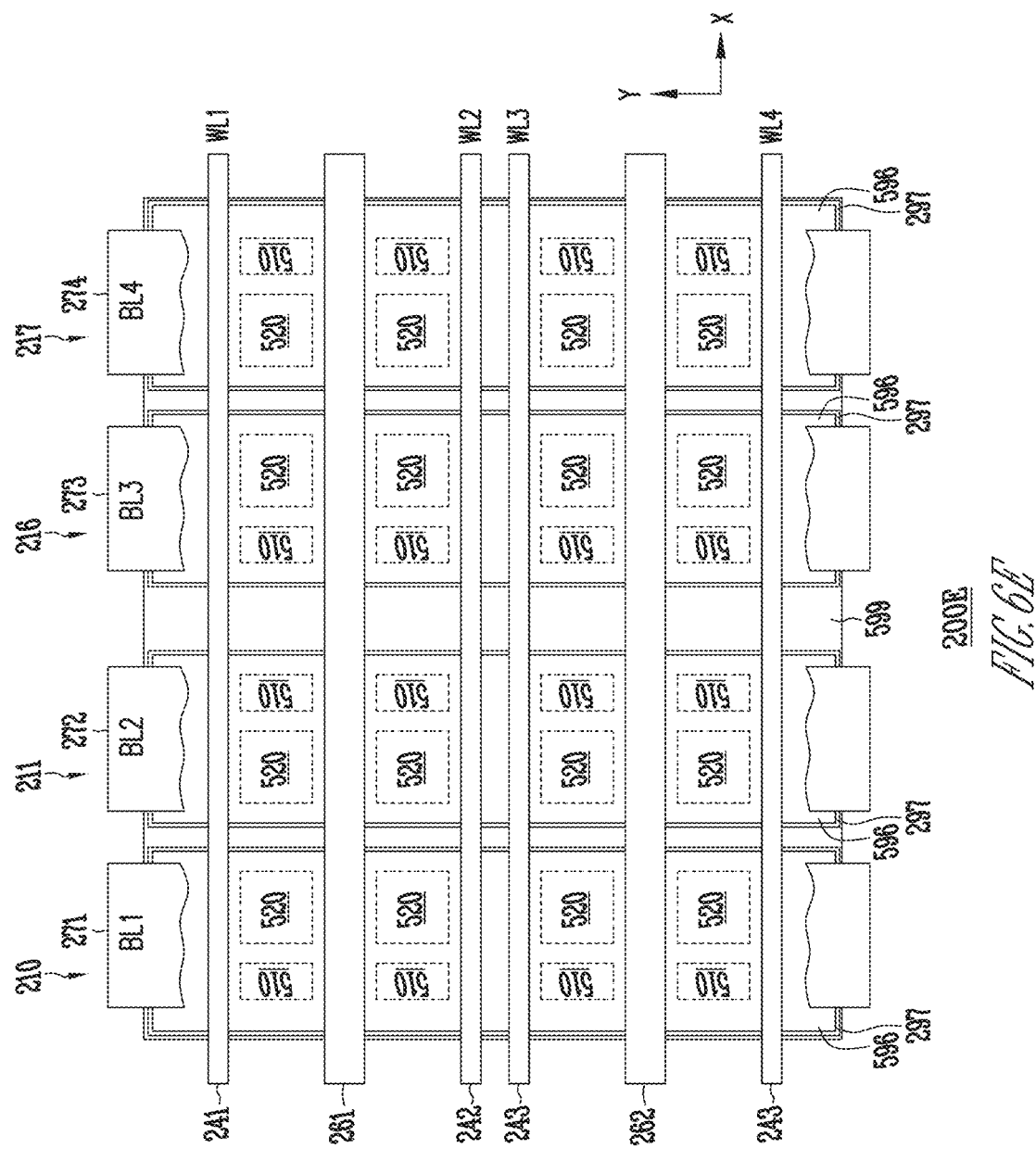
FIG. 6E shows an alternative structure of the memory device of FIG. 6D including separate bottom conductive strips, according to some embodiments described herein.

FIG. 5A and FIG. 5B show different 3-dimensional views (e.g., isometric views) of memory device 200 including memory cell 210 with respect to the X, Y, and Z directions. FIG. 6A shows a side view (e.g., cross-sectional view) of memory device 200 including memory cells 210, 211, 218, 219 with respect to the X-Z direction taken along line 6A-6A of FIG. 6C. FIG. 6B shows a view (e.g., cross-sectional view) taken along line 6B-6B of FIG. 6A and FIG. 6C. FIG. 6C shows a top view (e.g., plan view) of memory device 200 of FIG. 6A including relative locations of data lines 271, 272, 273, and 274 (and associated signals BL1, BL2, BL3, and BL4), and access lines 241, 242, 243, and 244 (associated signals WL1, WL2, WL3, and WL4). FIG. 6D shows a top view (e.g., plan view) of memory device 200 of FIG. 6C including portions of data lines 271, 272, 273, and 274 and common conductive structure (e.g., a common conductive plate) including semiconductor material 596 and ground connection 297 over substrate 599.

As shown in FIG. 5A and FIG. 5B, memory device 200 can include conductive shield structures 261 and 262 located adjacent respective sides of memory cells 210, 212, 214, and 216. For example, conductive shield structure 261 is between and adjacent sides of memory cells 210 and 212. Conductive shield structure 262 is between and adjacent sides of memory cells 214 and 216.

Each of access lines 241, 242, 243, and 244 can be located on a side of a respective memory cell that is opposite from the side of the respective memory cell where conductive shield structure 261 or 262 is located. Each of access line 241 and each of conductive shield structures 261 and 262 can include a structure (e.g., a piece (e.g., a layer)) of conductive material (e.g., metal, conductively doped polysilicon, or other conductive materials). Conductive shield structures 261 and 262 can have the same material as (or alternatively different materials from) access lines 241, 242, 243, and 244.

The following description refers to FIG. 5A through FIG. 6D. FIG. 5A and shows the structure of one memory cell (e.g., memory cell 210) of memory device 200 with data line 271 shown in exploded view (separated from memory cell 210) to show elements of memory cell 210 located below (under) data line 271. FIG. 5A shows details of memory cell 210. The structures of other memory cells (e.g., memory cells 211 through 217 in FIG. 2) of memory device 200 can be similar to or the same as the structure of memory cell 210 in FIG. 5A through FIG. 6D. In FIG. 2 through FIG. 6C, the same elements are given the same reference numbers. Some portions (e.g., gate oxide and cell isolation structures) of memory device 200 are omitted from FIG. 5A through FIG. 6D so as to not obscure the elements of memory device 200 in the embodiments described herein.

As shown in FIG. 5A, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) the X-direction and the Y-direction. The X-direction and Y-direction are perpendicular to each other.

As shown in FIG. 5A, ground connection 297 can include a structure (e.g., a piece (e.g., a layer)) of conductive material (e.g., conductive region) located over (formed over) substrate 599. Example materials for ground connection 297 include a piece of metal, conductively doped polysilicon, or other conductive materials. Ground connection 297 can be coupled to a ground terminal (not shown) of memory device 200. FIG. 5A shows ground connection 297 contacting (e.g., directly coupled to) substrate 599, as an example. In an alternative structure, memory device 200 can include a dielectric (e.g., a layer of dielectric material, not shown) between ground connection 297 and substrate 599.

As shown in FIG. 5A, memory device 200 can include a semiconductor material 596 formed over ground connection 297. Semiconductor material 596 can include a structure (e.g., a piece (e.g., a layer)) of silicon, polysilicon, or other semiconductor material, and can include a doped region (e.g., p-type doped region), or other conductive materials.

FIG. 6A shows memory cells 218 and 219 and associated data lines 273 and 274 that are not shown in FIG. 2. However, as shown in FIG. 6A, memory cells 218 and 219 can share access line 241 with memory cells 210 and 211. FIG. 6A shows conductive shield structure 261 and access line 241 can be located on opposite sides (e.g., front side and back side with respect the Y-direction) of each of memory cells 210, 211, 218, and 219. Conductive shield structure 261 can have a length in the X-direction. Only a portion (e.g., cutaway view) of conductive shield structure 261 in the X-direction is shown in FIG. 6A to expose details of memory cells 210, 211, 218, and 219.

As shown in FIG. 6A, conductive shield structure 261 can have a height H2 in the Z-direction. As shown in FIG. 6A and FIG. 6B, access line 241 can have a height H1 in the Z-direction. As shown in FIG. 6B, the Z-direction is perpendicular to the Y-direction, which is also a direction from one memory cell to the next memory cell (e.g., from memory cell 210 to memory cell 212) in the Y-direction.

Heights H1 and H2 and can be the same (equal in dimension). However (e.g., FIG. 7), conductive shield structure 261 can be structured (e.g., formed) such that conductive shield structure 261 can have a height H2' (FIG. 6A) greater than height H2. Thus, the height of conductive shield structure 261 can be the same as the height of access line 241 (e.g., H2=H1) or greater than the height of access line 241 (e.g., H2'>H1).

As shown in FIG. 6B, access line 241 can have a thickness W1 the Y-direction, which is parallel to a direction from memory one memory cell to the next memory cell (e.g., from memory cell 210 to memory cell 212) in the Y-direction. As shown in FIG. 6B, conductive shield structure 261 can have thickness W2. Thickness W2 can be greater than thickness W1 (e.g., W2>W1). However (e.g., FIG. 8), conductive shield structure 261 can be structured (e.g., formed), such that conductive shield structure 261 can have a thickness (in the Y-direction) that is the same as (equal to) the thickness of access line 241.

As shown in FIG. 6B, like access line 241, each of access lines 242, 243, and 244 can have height H1 and thickness W1. Like conductive shield structure 261, other conductive shield structures (e.g., conductive shield structure 262) of memory device 200 can have height H2 and a thickness W2.

As shown in FIG. 6B, memory device 200 can include trenches 290, 291, 292, 293, and 294 that have different (unequal) widths (trench width) TW1 and TW2. Each of trenches 291 and 292 can have width TW1. Trench 292 (also trenches 290 and 294) can have width TW2. Width TW2 can be greater than width TW1. Alternatively, trenches 290, 291, 292, 293, and 294 and have the same (equal) width. For example, in an alternative structure of memory device 200, each of trenches 291 and 291 can have a width TW1' (not shown), and trench 292 (also trenches 290 and 294) can have a width TW2' (not shown) where width TW1' can be the same as width TW2' (e.g., TW1'=TW2').

As shown in FIG. 6B, access lines 241, 242, 243, and 244 and conductive shield structures 261 and 262 can be located in respective trenches 290. 291, 292, 293, and 294. In memory device 200, as shown in FIG. 6B, not all trenches (fewer than all trenches) 290, 291, 292, 293, and 294 have an access line (or access lines) located in them. For example, trenches 291 and 293 do not have an access line located in them. Thus, trenches 291 and 293 are void of an access line (among access lines 241, 242, 243, and 244). This mean that none of access lines 241, 242, 243, and 244 is located in trenches 291 and 293. The trenches that do not have a conductive shield structure (e.g., conductive shield structures 261 or 262) can have an access line (e.g., access line 241 in trench 290 or access line 244 in trench 294) or multiple access lines (e.g., access lines 242 and 243 in trench 292).

As shown in FIG. 6B, memory device 200 can include dielectric materials 545 located in trenches 290, 291, 292, 293, and 294 to electrically separate access lines 241, 242, 243, and 244 and conductive shield structures 261 and 262 from other elements (e.g., read and write channel regions, and charge storage structures) of the memory cells (e.g., memory cells 210, 212, 214, and 216) of memory device 200.

Each of memory cells 210, 212, 214, and 216 can be located between and adjacent two respective trenches among trenches 290, 291, 292, 293, and 294. For example, memory cell 210 can be located between trenches 290 and 291. Memory cell 212 can be located between trenches 291 and 292.

Thus, as shown in FIG. 6B, each memory cell can have opposite sides (e.g., left side and right side in the Y-direction). Each access line (e.g., 242) can be located in a trench (e.g., 292) and adjacent a side of a memory cell (e.g., right side of memory cell 212) in the Y-direction. Each conductive shield structure can be located in trench (e.g., 291) and adjacent a side of a memory cell (e.g., left side of memory cell 212) in Y-direction.

As shown in FIG. 6B, each of conductive shield structures 261 and 262 in a particular trench (among trenches 290, 291, 292, 293, and 294) can be electrically separated from the elements of adjacent memory cells by dielectric materials 545 in that particular trench. For example, as shown in FIG. 6B, each of memory cells 210, 212, 214, and 216 can include material (e.g., write channel region) 520 formed over charge storage structure 202. Conductive shield structure 261 can be electrically separated from materials 520 of memory cells 210 and 212 by respective dielectric materials 545 in trench 291. As shown in FIG. 6B, dielectric materials 545 in trench 291 can be adjacent (e.g., can contact or indirectly contact) materials 520 and charge storage structures 202 of respective memory cells 210 and 212. Conductive shield structure 261 can be between dielectric materials 545 and adjacent (e.g., contacting or indirectly contacting) dielectric materials 545.

Charge storage structure 202 (FIG. 5A through FIG. 6D) of each memory cell of memory device 200 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and the access lines (e.g., access line 241) of memory device 200 can be the same or can be different. As shown in FIG. 5A, FIG. 6A, and FIG. 6B, charge storage structure 202 can include a portion (e.g., bottom portion) that is closer (e.g., extends in the Z-direction closer) to substrate 599 than the bottom of access line 241.

As shown in FIG. 6A, each charge storage structure 202 can include an edge (e.g., top edge) 202', and access line 241 can include an edge (e.g., bottom edge) 241E. FIG. 6A shows an example where edge 202' is at a specific distance (e.g., distance shown in FIG. 6A) from edge 241E. However, the distance between edge 202' of charge storage structure 202 and edge 241E of access line 241 can vary. For example, FIG. 6A shows edge 241E being below edge 202' with respect to the Z-direction, such that access line 241 can overlap (in the Z-direction) charge storage structure 202. However, edge 241E can alternatively be above edge 202' with respect to the Z-direction, such that access line 241 may not overlap (in the Z-direction) charge storage structure 202.

As shown in FIG. 6A, material 520 can be located between data line 271 and charge storage structure 202. Material 520 can be electrically coupled to (e.g., directly coupled to (contact)) data line 271. Material 520 can also be electrically coupled to (e.g., directly coupled to (contact)) charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction and the memory element contacts (e.g., directly coupled to) material 520.

Material 520 can form a source (e.g., source terminal), a drain (e.g., drain terminal), and a channel region (e.g., write channel region) between the source and the drain of transistor T2 of memory cell 210. Thus, as shown in FIG. 5A, FIG. 6A, and FIG. 6B, the source, channel region, and the drain of transistor T2 of memory cell 210 can be formed from a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type). Other memory cells of memory device 200 can also include material 520 like memory cell 210.

Material 520 can include a structure (e.g., a piece (e.g., a layer)) of semiconductor material. In the example where transistor T2 is an NFET (as described above), material 520 can include n-type semiconductor material (e.g., n-type silicon).

In another example, the semiconductor material that forms material 520 can include a structure (e.g., a piece) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210), charge from charge storage structure 202 of the selected memory cell may leak to transistor T2 of the selected memory cell. Using the material listed above for the channel region (e.g., material 520) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5A, FIG. 6A, and FIG. 6B, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In an alternative structure (not shown), material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material) between charge storage structure 202 of memory cell 210 and material 520.

As shown in FIG. 5A, FIG. 6A, FIG. 6C, and FIG. 6D, memory cell 210 can include a material 510, which can include a structure (e.g., a piece (e.g., a layer)) of semiconductor material. Example materials for material 510 can include silicon, polysilicon (e.g., undoped or doped polysilicon), germanium, silicon-germanium, or other semiconductor materials and semiconducting oxide materials (oxide semiconductors, e.g., SnO or other oxide semiconductors).

As described above with reference to FIG. 2, transistor T1 of memory cell 210 includes a channel region (e.g., read channel region). In FIG. 5A, FIG. 6A. FIG. 6C, and FIG. 6D, the channel region of transistor T1 of memory cell 210 can include (e.g., can be formed from) material 510. Material 510 can be electrically coupled to (e.g., directly coupled to (contact) data line 271. As described above with reference to FIG. 2, memory cell 210 can include a read path. In FIG. 5A and FIG. 6A through FIG. 6D, material 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, material 510 can conduct a current (e.g., read current (e.g., holes)) between data line 271 and ground connection 297 (through part of semiconductor material 596). The direction of the read current can be from data line 271 to ground connection 297 (through material 510 and part of semiconductor material 596). In the example where transistor T1 is a PFET and transistor T2 is an NFET, the material that forms material 510 can have a different conductivity type from material 520. For example, material 510 can include p-type semiconductor material (e.g., p-type silicon) regions, and material 520 can include n-type semiconductor material (e.g., n-type gallium phosphide (GaP)) regions.

As shown in FIG. 5A and FIG. 6A, memory cell 210 can include dielectric materials 515A and 515B. Dielectric materials 515A and 515B can be gate oxide regions that electrically separate each of charge storage structure 202 and material 520 from material 510 (e.g., the channel region of transistor T1). Dielectric materials 515A and 515B can also electrically separate charge storage structure 202 from semiconductor material 596.

Example materials for dielectric materials 515A and 515B include silicon dioxide, hafnium oxide (e.g., HfO$_2$), aluminum oxide (e.g., Al$_2$O$_3$), or other dielectric materials. In an example structure of memory device 200, dielectric materials 515A and 515B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 5A and FIG. 6A, the memory cells (e.g., memory cells 210, 211, 218, and 219) of memory device 200 can share (e.g., can electrically couple to) semiconductor material 596. For example, as shown in FIG. 6A, the read channel regions of the memory cells (e.g., material 510 of each of memory cells 210, 211, 218, and 219) of memory device 200 can contact (e.g., can be electrically coupled to) semiconductor material 596.

As shown in FIG. 5A and FIG. 6A, memory device 200 can include a conductive region 597 (e.g., a common conductive plate) under the memory cells (e.g., memory cells 210, 211, 216, and 217 in FIG. 6A) of memory device 200. Conductive region 597 can include at least one of the materials (e.g., doped polysilicon) of semiconductor material 596 and the material (e.g., metal or doped polysilicon) of ground connection 297. For example, conductive region 597 can include the material of semiconductor material 596, the material of ground connection 297, or the combination of the materials of semiconductor material 596 and ground connection 297. Thus, as shown FIG. 6A, the memory cells (e.g., memory cells 210, 211, 216, and 217) of memory device 200 can share conductive region 597 (which can include any combination of semiconductor material 596 and ground connection 297).

As shown in FIG. 5A and FIG. 6A, access line 241 can be adjacent part of material 510 and part of material 520 and can span across (e.g., overlap in the X-direction) part of material 510 and part of material 520. As described above, material 510 can form part of a read channel region of transistor T1 and material 520 can form part of a write channel region of transistor T2. Thus, as shown in FIG. 5A and FIG. 6A, access line 241 can span across (e.g., overlap) part of (e.g., on a side (e.g., front side) in the Y-direction) both read and write channels of transistors T1 and T2, respectively. As shown in FIG. 6A, access line 241 can also span across (e.g., overlap in the X-direction) pail of material 510 (e.g., a portion of the read channel region of transistor T1) and part of material 520 (e.g., a portion of write channel region of transistor T2) of other memory cells (e.g., memory cells 211, 218, and 219) of memory device 200. The spanning (e.g., overlapping) of access line 241 across material 510 and material 520 allows access line 241 (a single access line) to control (e.g., to turn on or turn off) both transistors T1 and T2 of memory cells 210, 211, 218, and 219.

As shown in FIG. 6A, memory device 200 can include dielectric material (e.g., silicon dioxide) 526 that can form a structure (e.g., a dielectric) to electrically separate (e.g., isolate) parts of two adjacent (in the X-direction) memory cells of memory device 200. For example, dielectric material 526 between memory cells 210 and 211 can electrically separate material 520 (e.g., write channel region of transistor T2) of memory cell 210 from material 520 (e.g., write channel region of transistor T2) of memory cell 211, and electrically separate charge storage structure 202 of memory cell 210 from charge storage structure 202 of memory cell 211.

As shown in FIG. 6A, memory device 200 can include dielectric portions 555. Material (e.g., read channel region) 510 of two adjacent memory cells (e.g., memory cells 211 and 218) can be electrically separated from each other by one of dielectric portions 555. Some of portions (e.g., materials) of the memory cells of memory device 200 can be formed adjacent (e.g., formed on) a side wall (e.g., vertical portion with respect to the Z-direction) of a respective dielectric portion among dielectric portions 555. For example, as shown in FIG. 6A, material 510 (e.g., semiconductor material portion) of memory cell 210 can be formed adjacent (e.g., formed on) a side wall (not labeled) of dielectric portion 555 (on the left of memory cell 210). In another example, material 510 (e.g., semiconductor material portion) of memory cell 211 can be formed adjacent (e.g., formed on) a side wall (not labeled) of dielectric portion 555 between memory cells 211 and 216.

Dielectric materials 545 can be the same as (or alternatively, different from) the material (or materials) of dielectric materials 515A and 515B. Example materials for dielectric materials 545 can include silicon dioxide, hafnium oxide (e.g., $HfO_2$), aluminum oxide (e.g., $Al_2O_3$), or other dielectric materials.

The above description focuses on the structure of memory cell 210. Other memory cells (e.g., memory cells 211, 218, and 219 in FIG. 6A) of memory device 200 can include elements structured in ways similar or the same as the elements of memory cell 210, described above. For example, as shown in FIG. 6A, memory cell 211 can include charge storage structure 202, material (e.g., write channel region) 520, material 510 (e.g., read channel region), and dielectric materials 525A and 525B. The material (or materials) for dielectric materials 525A and 525B can the same as the material (or materials) for dielectric materials 515A and 515B. Memory cells 218 and 219 can include elements structured in ways similar or the same as the elements of memory cells 210 and 211, respectively.

FIG. 6C shows a top view (e.g., plan view) of a portion of memory device 200 of FIG. 2, FIG. 6A, and FIG. 6B. For simplicity, some elements of memory device 200 are omitted from FIG. 6C. FIG. 6C shows relative locations of data lines 271, 272, 273, and 274 (and associated signals BL1, BL2, BL3, and BL4), and access lines 241, 242, 243, and 244 (associated signals WL1, WL2, WL3, and WL4). FIG. 6C also shows relative locations of trenches 290, 291, 292, 293, and 294 (also shown in FIG. 6B).

The following description describes data line 271. Other data lines (e.g., data lines 272, 273, and 274) of memory device 200 can have similar structure and material as data line 271. As shown in FIG. 5A, FIG. 5B, FIG. 6A, FIG. 6B, and FIG. 6C, data line 271 (associated with signal BL1) can have a length in the Y-direction, a width in the X-direction, and a thickness in the Z-direction. Data line 271 can include a conductive material (or a combination of materials) that can be structured as a conductive line (e.g., conductive region) having a length in the Y-direction. Example materials for data line 271 include metal, conductively doped polysilicon, or other conductive materials. Other data lines 272, 273, and 274 (associated with signals BL2, BL3, and BL4, respectively) can have a length, a width, a thickness, and a material similar to or the same as data line 271.

FIG. 6D shows a top view of memory device 200 including a common conductive structure (e.g., a common conductive plate) including semiconductor material 596 and ground connection 297 over substrate 599.

FIG. 6E shows a top view of memory device 200E including separate conductive structures (e.g., separate conductive strips) unlike the common conductive structure (e.g., a common conductive plate) of FIG. 6D. As shown in FIG. 6E, semiconductor material 596 and ground connection 297 can be divided (e.g., patterned) into separate conductive structures having length along the Y-direction, which is also the direction of (e.g., parallel to) the length of each of data lines 271, 272, 273, and 274. Memory cells coupled to the same data line can share a respective conductive structure (formed under memory cells). In an alternative structure (not shown) of memory device 200E, semiconductor material 596 and ground connection 297 can be divided (e.g., patterned) into separate conductive structures having length along the X-direction, which is also the direction of (e.g., parallel to) the length of each of access lines 241, 242, 243, and 244. Each of the conductive strips having the length in the Y-direction in the structure shown in FIG. 6E (or having length in the X-direction (not shown) in an alternative structure) can be individually coupled ground during an operation (e.g., read or write operation) of memory device 200E.

The structure of memory device 200 allows it to have a relatively smaller size (e.g., smaller footprint) and improved (e.g., reduced) power consumption (as result of using a single access line (e.g., word line) to control two transistors of a corresponding memory cell). Other improvements and benefits of memory device 200 are described below.

In the 2T memory cell structure of memory device 200, the threshold voltage (e.g., Vt2) of transistor T2 can be relatively high for proper operation of memory device 200. For example, the threshold voltage of transistor T2 can be relatively high, so that transistor T2 can be properly turn on (e.g., during a write operation) and properly turn off (e.g., during a read operation). Including conductive shield structures (e.g., conductive shield structures 261 and 262) in memory device 200 can allow transistor T2 to have a relatively more relaxed threshold voltage (e.g., a reduced Vt2).

The conductive shield structures can also suppress or prevent potential leakage of current (e.g., leakage through transistor T2) in the memory cell. This can improve retention of information stored in the memory cell.

Further, the conductive shield structures of memory device 200 can reduce capacitive coupling between adjacent access lines. This can mitigate disturbance between the charge storage structures of adjacent memory cells associated with different access lines.

Moreover, the conductive shield structures may boost the capacitance of the charge storage structure (e.g., charge storage structure 202) of memory device 200. This can lead to improve operation (e.g., read operation) of memory device 200.

FIG. 7 shows a memory device 700 including conductive shield structures 261 and 262 having respective heights (e.g., H2') greater than the heights (e.g., H1) of access lines 241 242, 243, and 244, according to some embodiments described herein. As shown in FIG. 7, each of heigh H2' and H1 is measured (e.g., in nanometers) in the Z-direction and height H2' is greater than heigh H1 (e.g., H2' >H1) as also described above with reference to FIG. 6A. Memory device 700 can have improvements and benefits similar to those of memory device 200 described above.

FIG. 8 shows a memory device 800 including conductive shield structures 261 and 262 and access lines 241 242, 243, and 244 having the same thickness W3, according to some embodiments described herein. As shown in FIG. 8, memory device 800 can include trenches (not labeled but they can be like trenches 290, 291, 292, 293, and 294 in FIG. 6B) having respective widths TW1 and TW2 (like widths TW1 and TW2 in FIG. 6B). Alternatively, the trenches of memory device 800 can have the same (equal) width. For example, in an alternative structure (not shown) of memory device 800, trenches of memory device 800 can have the same width (e.g., width TW1=TW2, not shown in FIG. 8). Memory device 800 can have improvements and benefits similar to those of memory device 200 described above.

As described above with reference to FIG. 5A through FIG. 8, memory devices 200, 200E (FIG. 6E), 70, and 800 can have conductive shield structures 261 and 262, access lines 241 242, 243, and 244, and trenches 290, 292, 293, 294, and 295 with corresponding thicknesses and widths (e.g., W1, W2, W3, H1, H2, H2', TW1, TW1', TW2, and TW2') shown in FIG. 5A through FIG. 8. However, the memory device described herein can be structured (e.g., can be formed) to include any combination of thicknesses and widths described above. For example, the thicknesses of widths of respective conductive shield structures 261 and 262, access lines 241 242, 243, and 244, and trenches 290, 292, 293, 294, and 295 can be any combination of W1, W2, W3, H1, H2, H2', TW1, TW1', TW2, and TW2'.

FIG. 9 through FIG. 22C show different views of elements during processes of forming a memory device 900, according to some embodiments described herein. Some or all of the processes used to form memory device 900 can be used to form memory devices 200, 200E, 700, and 800 described above with reference to FIG. 2 through FIG. 8.

FIG. 9 shows memory device 900 after different levels (e.g., layers) of materials are formed in respective levels (e.g., layers) of memory device 900 in the Z-direction over a substrate 999. The different levels of materials include a dielectric material 930, a semiconductor material 996, and a conductive material 997. Dielectric material 930, semiconductor material 996, and conductive material 997 can be formed in a sequential fashion one material after another over substrate 999. For example, the processes used in FIG. 9 can include forming (e.g., depositing) conductive material 997 over substrate 999, forming (e.g., depositing) semiconductor material 996 over conductive material 997, and forming (e.g., depositing) dielectric material 930 over semiconductor material 996.

Substrate 999 can be similar to or identical to substrate 599 of FIG. 5. Conductive material 997 can include a material (or materials) similar to or identical to that of the material for ground connection 297 of memory device 200 (FIG. 5 through FIG. 8). For example, conductive material 997 can include metal, conductively doped polysilicon, or other conductive materials.

Semiconductor material 996 includes a material (or materials) similar to or identical to that of the material for semiconductor material 596 of memory device 200 (FIG. 5A and FIG. 6A). For example, semiconductor material 996 can include silicon, polysilicon, or other semiconductor material, and can include a doped region (e.g., p-type doped region). As described below in subsequent processes of forming memory device 900, semiconductor material 996 can be structured to form part of a channel region (e.g., read channel region) for a respective memory cell of memory device 900.

Dielectric materials 930 of FIG. 9 can include a nitride material (e.g., silicon nitride (e.g., $Si_3N_4$)), oxide material (e.g., $SiO_2$), or other dielectric materials. As described below in subsequent processes of forming memory device 900, dielectric material 930 can be processed into dielectric portions to form part of cell isolation structures to electrically isolate one memory cell from another memory cell of memory device 900.

Figure 10:
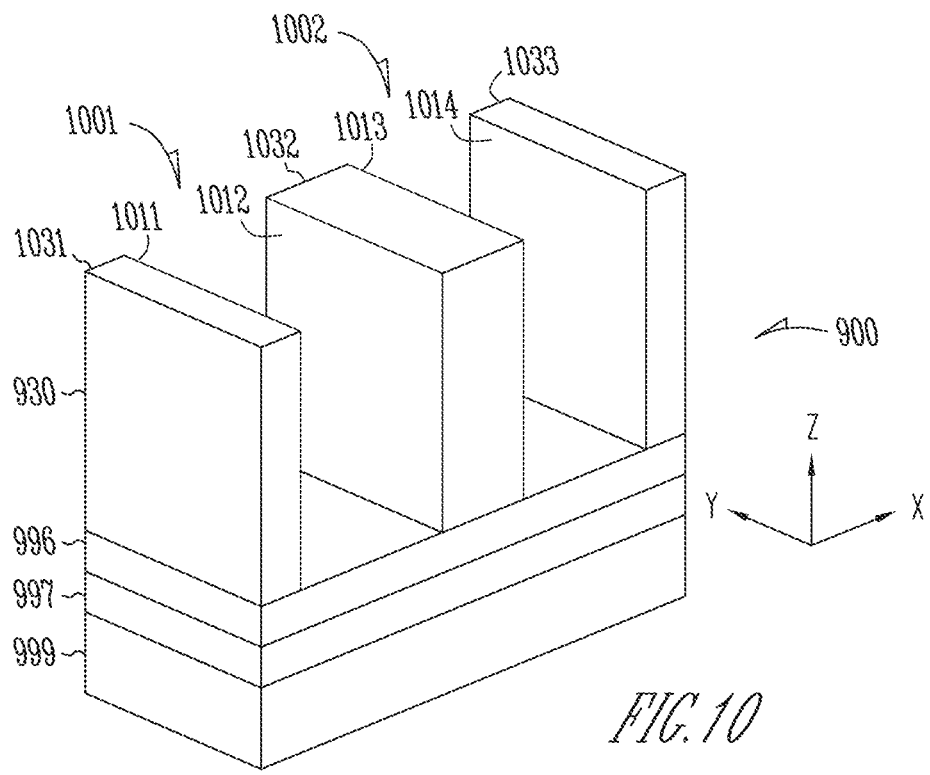

FIG. 10 shows memory device 900 after trenches (e.g., openings) 1001 and 1002 are formed. Forming trenches 1001 and 1002 can include removing (e.g., by patterning) part of dielectric material 930 (FIG. 9) at the locations of trenches 1001 and 1002 and leaving portions (e.g., dielectric portions) 1031, 1032, and 1033 (which are remaining portions of dielectric material 930) as shown in FIG. 10.

Each of trenches 1001 and 1002 can have a length in the Y-direction, a width (shorter than the length) in the X-direction, and a bottom (not labeled) resting on (e.g., bounded by) a respective portion of semiconductor material 996. Each of trenches 1001 and 1002 can include opposing side walls (e.g., vertical side walls) formed by respective portions 1031, 1032, and 1033. For example, trench 1001 can include a side wall 1011 (formed by portion 1031) and a side wall 1012 (formed by portion 1032). Trench 1002 can include a side wall 1013 (formed by portion 1032) and a side wall 1014 (formed by portion 1033).

Figure 11:
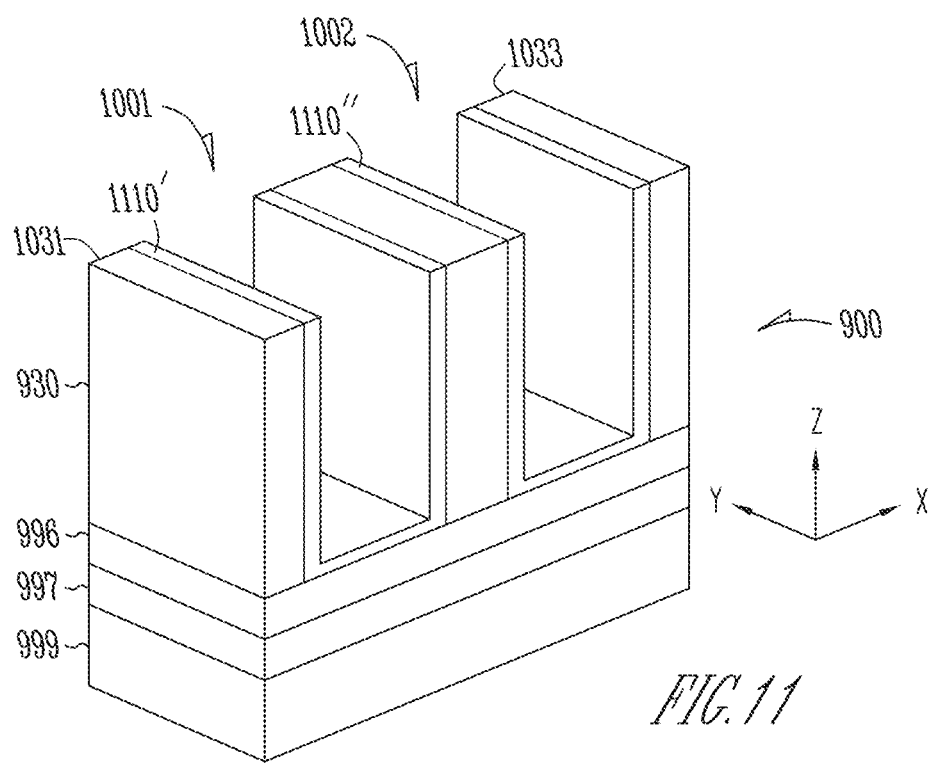

FIG. 11 shows memory device 900 after a material 1110' and a material 1110" are formed (e.g., deposited) in trenches 1001 and 1002, respectively. As shown in FIG. 11, material 1110' can be formed on side walls 1011 and 1012 and on the bottom (e.g., on a portion of semiconductor material 996) of trench 1001. Material 1110" can be formed on side walls 1013 and 1014 and on the bottom (e.g., on another portion of semiconductor material 996) of trench 1002.

Materials 1110' and 1110" can be the same material. An example of material 1110' and material 1110" includes a semiconductor material. Materials 1110' and 1110" can have the same properties as the materials that form portions 510A, 510B, 511A, and 511B (e.g., read channel regions) of transistors T1 of respective memory cells of memory device 200 of FIG. 5A and FIG. 6A. As described below in subsequent processes (e.g., FIG. 19A) of forming memory device 900, materials 1110' and 1110" can be structured to form channel regions (e.g., read channel regions) of transistors (e.g., transistors T1) of respective memory cells of memory device 900. Thus, each of materials 1110' and 1110" can conduct a current (e.g., conduct holes) during an operation (e.g., a read operation) of memory device 900.

The process of forming materials 1110' and 1110" can include a doping process. Such a doping process can include introducing dopants into materials 1110' and 1110" to allow a transistor (e.g., transistor T1) of a respective memory cell of memory device 900 to include a specific structure. For example, the doping process used in FIG. 9 can include introducing dopants (e.g., using a laser anneal process) with different dopant concentrations for different parts of materials 1110' and 1110", such that the transistor that includes material 1110' (or material 1110") can have a PFET structure. In such a PFET structure, part of material 1110' (or material 1110") can form a channel region (e.g., read channel region) to conduct currents (e.g., holes) during an operation (e.g., read operation) of memory device 900.

Figure 12:
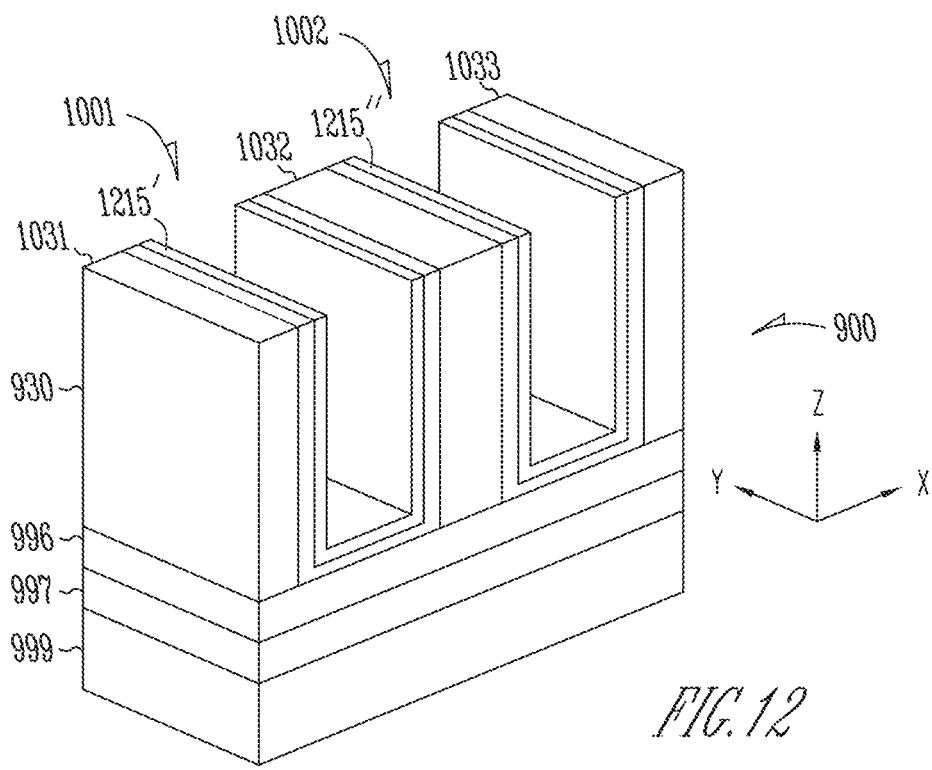

FIG. 12 shows memory device 900 after dielectric materials (e.g., oxide materials) 1215' and 1215" are formed (e.g., deposited) on materials 1110' and 1110", respectively. Dielectric materials 1215' and 1215" can be deposited, such that dielectric materials 1215' and 1215" can be conformal to materials 1110' and 1110", respectively. Materials 1215' and 1215" can have the same properties as the materials (e.g., oxide materials) that form dielectric materials 515A, 515B, 525A, and 525B of memory device 200 of FIG. 5A and FIG. 6A.

Figure 13:
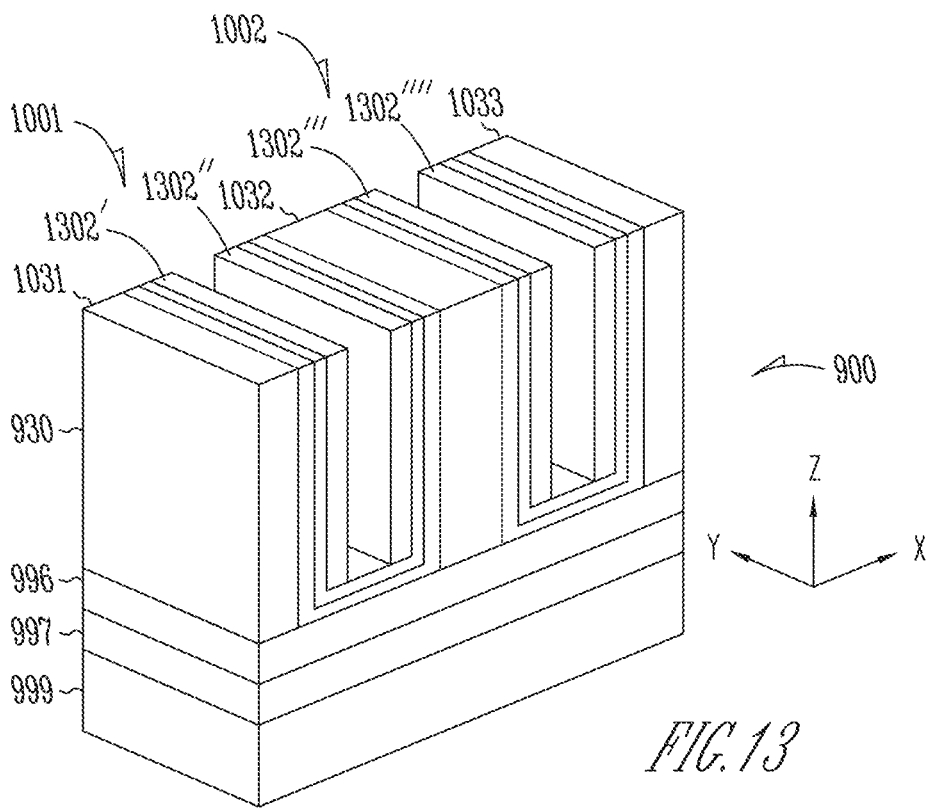

FIG. 13 shows memory device 900 after materials (e.g., charge storage materials) 1302', 1302", 1302''', and 1302'''' are formed on respective side walls of materials 1215' and 1215". Materials 1302', 1302", 1302''', and 1302'''' are electrically separated from each other. As described below in subsequent processes (FIG. 19) of forming memory device 900, each of materials 1302', 1302", 1302''', 1302'''' can be structured to form a charge storage structure of a respective memory cell of memory device 900. Materials 1302', 1302", 1302''', 1302'''' can include material (e.g., polysilicon) similar or identical to the material of charge storage structure 202 of the memory cells (e.g., memory cell 210 or 211) of memory device 200 (FIG. 5A and FIG. 6A).

Figure 14:
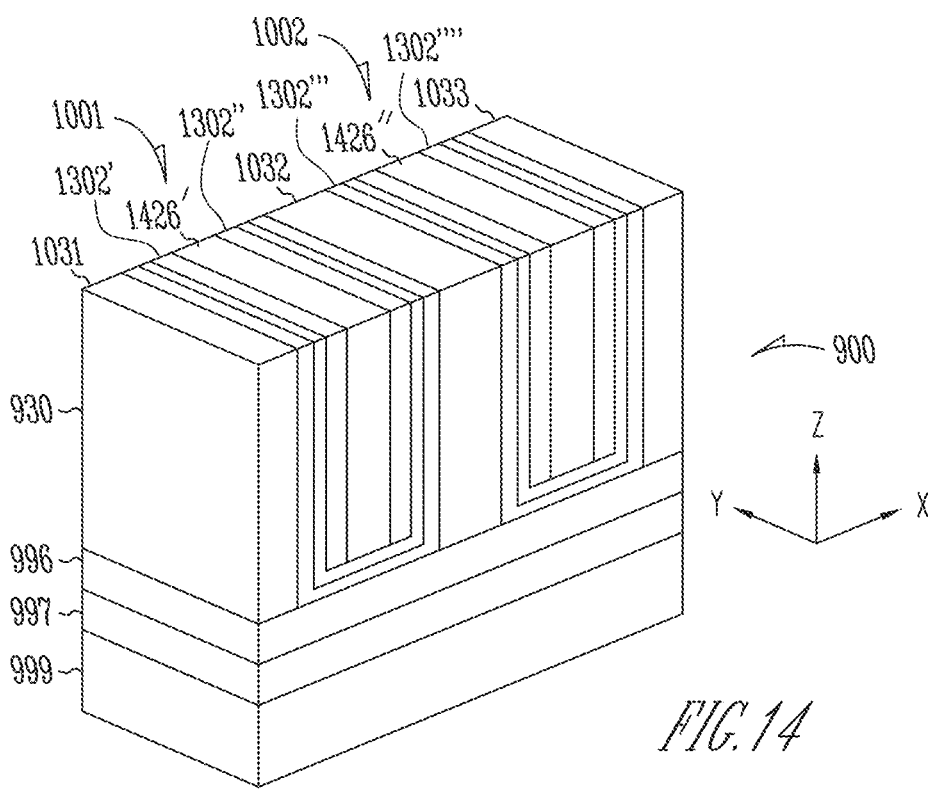

FIG. 14 shows memory device 900 after dielectric materials 1426' and 1426" are formed (e.g., filled) in opened spaces in trenches 1001 and 1002, respectively. Dielectric materials 1426' and 1426" can include an oxide material. As described below in subsequent processes of forming memory device 900, dielectric materials 1426' and 1426" can form part of an isolation structure that can electrically isolate parts of (e.g., charge storage structures) two adjacent (in the X-direction) memory cells of memory device 900.

Figure 15:
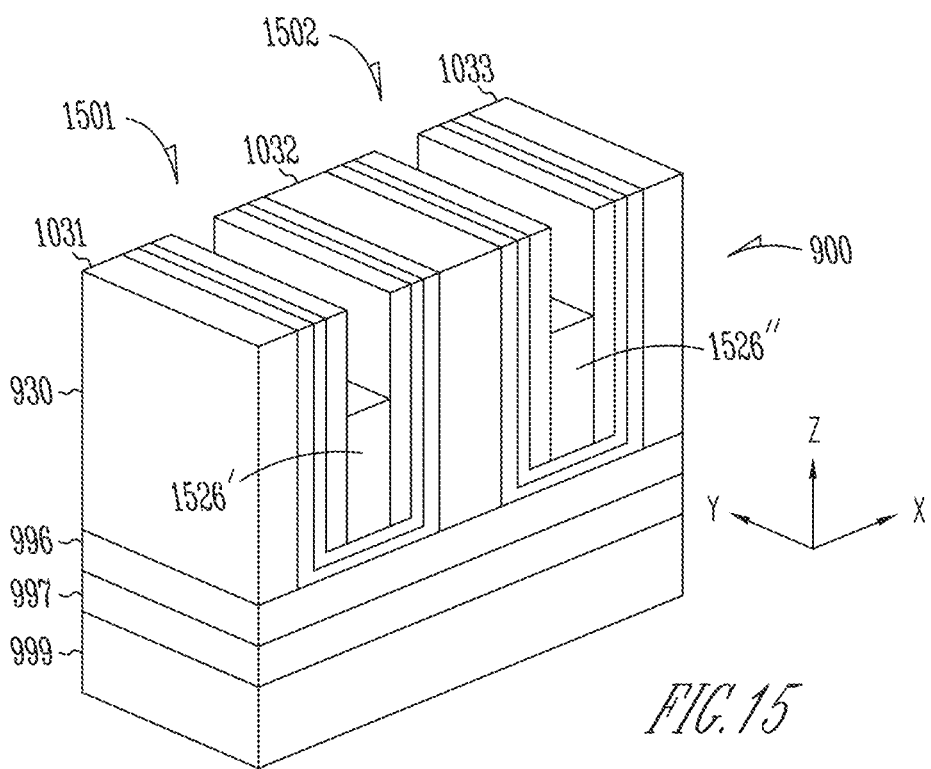

FIG. 15 shows memory device 900 after dielectric materials 1526' and 1526" are formed at locations 1501 and 1502, respectively. Forming dielectric materials 1526' and 1526" can include removing (e.g., by using an etch process) part (e.g., top part) of each of dielectric materials 1426' and 1426" (FIG. 14), such that the remaining parts of dielectric materials 1426' and 1426" are dielectric materials 1526' and 1526" (FIG. 15), respectively.

Figure 16:
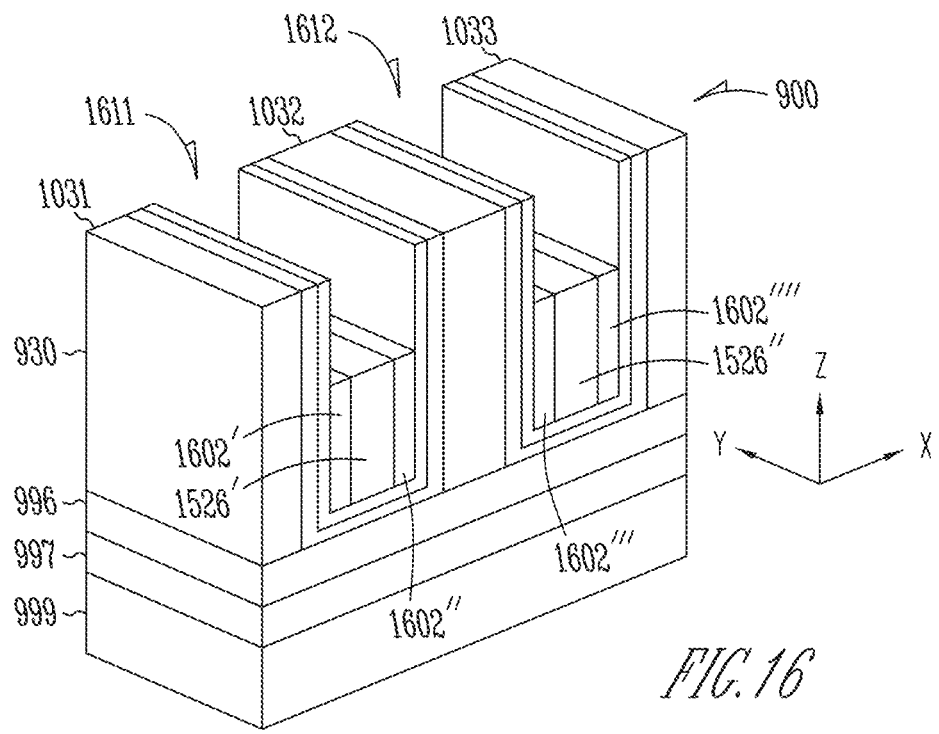

FIG. 16 shows memory device 900 after materials 1602', 1602", 1602''', and 1602'''' are formed at locations 1611 and 1612, respectively. Forming materials 1602', 1602", 1602''', and 1602'''' can include removing (e.g., by using an etch process) part (e.g., top part) of each of dielectric materials 1302', 1302", 1302''', and 1302'''' (FIG. 13), such that the remaining parts of materials 1302', 1302", 1302''', and 1302'''' are materials 1602', 1602", 1602''', and 1602'''' (FIG. 16), respectively.

In FIG. 14, FIG. 15, and FIG. 16, part (e.g., top part) of dielectric materials 1426' and 1426" (FIG. 14) and part (e.g., top part) of materials 1302', 1302", 1302''', 1302'''' (FIG. 14) were removed in separate processes (e.g., multiple steps) as described with reference to FIG. 15 and FIG. 16. However, a single process (e.g., single step) can be used to remove part of dielectric materials 1426' and 1426" (FIG. 14) and part of materials 1302', 1302", 1302''', 1302'''' (FIG. 14).

Figure 17:
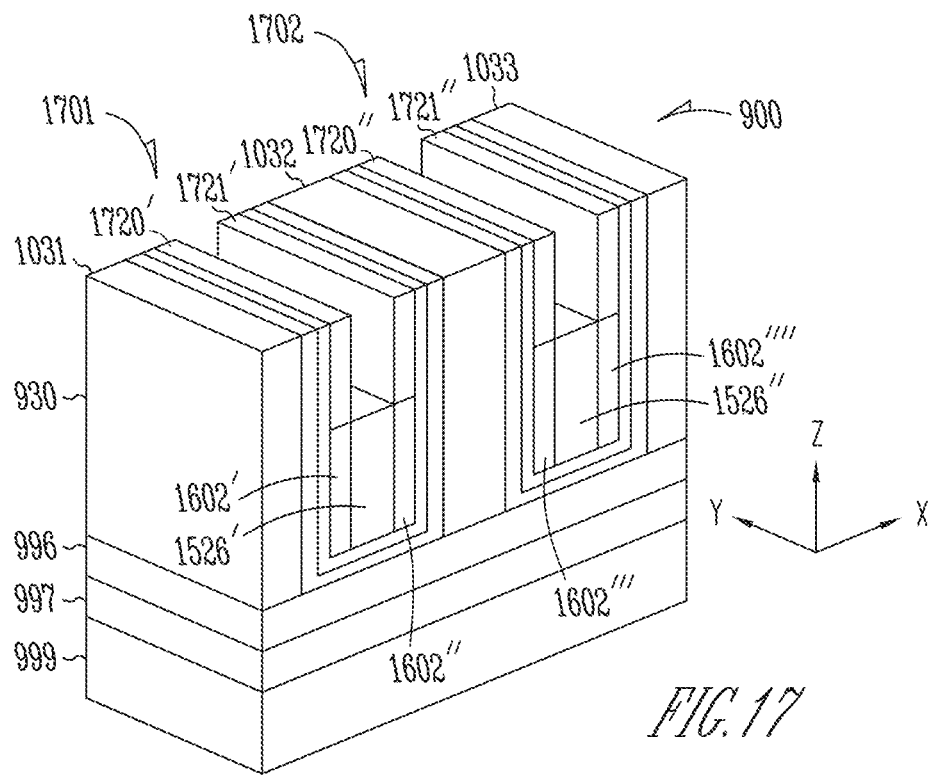

FIG. 17 shows memory device 900 after materials 1720', 1721', 1720", and 1721" are formed. Forming materials 1720', 1721', 1720", and 1721" can include depositing an initial material (or materials) on dielectric materials 1526' and 1526" and materials 1602', 1602", 1602''', and 1602''''. Then, the process used in FIG. 17 can include removing (e.g., by using an etch process) a portion of the initial material at locations 1701 and 1702. Materials 1720', 1721', 1720", and 1721" are the remaining portions of the initial material. As shown in FIG. 17, materials 1720', 1721', 1720", and 1721" are electrically separated from each other. However, materials 1720', 1721', 1720", and 1721" are electrically coupled to (e.g., directly coupled to) materials 1602', 1602", 1602''', and 1602'''', respectively.

Materials 1720', 1721', 1720", and 1721" can include materials similar or identical to material (e.g., write channel region) 520 (FIG. 5A and FIG. 6A) of transistor T2 of memory device 200 of FIG. 5A and FIG. 6A. As described below in subsequent processes (FIG. 19) of forming memory device 900, each of materials 1720', 1721', 1720", and 1721" can form a channel region (e.g., write channel region) of a transistor (e.g., transistor T2) of a respective memory cell of memory device 900. Thus, each of materials 1720', 1721', 1720", and 1721" can conduct a current (e.g., conduct electrons) during an operation (e.g., a write operation) of memory device 900.

Figure 18:
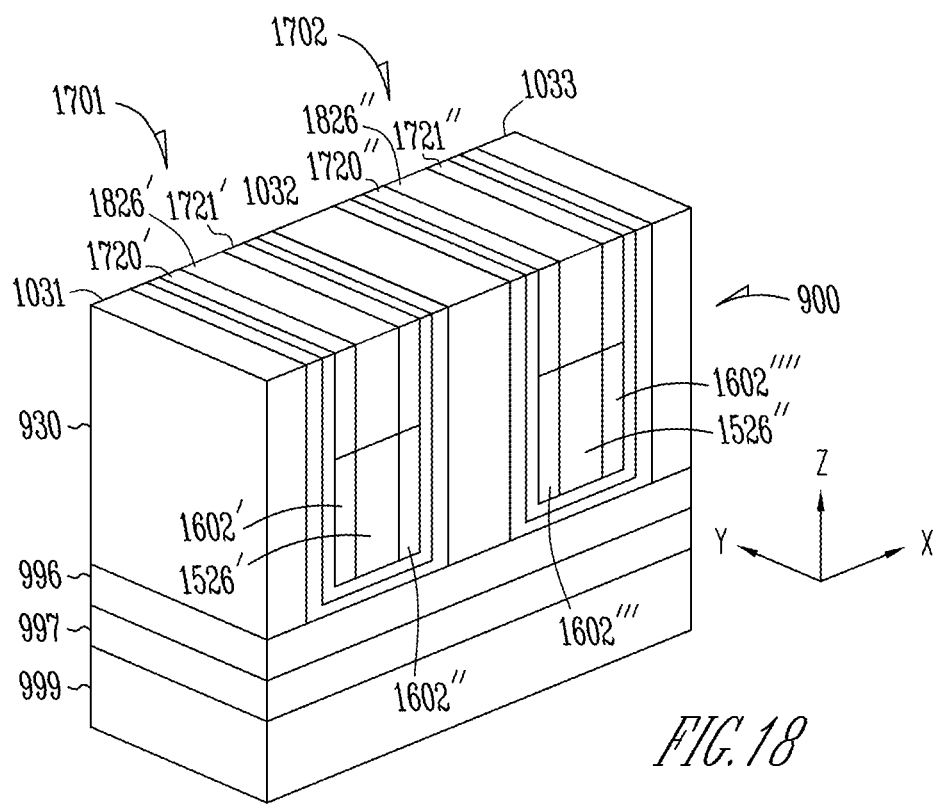

FIG. 18 shows memory device 900 after dielectric materials 1826' and 1826" are formed at (e.g., filled in) locations 1701 and 1702. Dielectric materials 1826' and 1826" can be the same as dielectric materials 1426' and 1426". As described below in subsequent processes of forming memory device 900, dielectric materials 1826' and 1826" can form part of an isolation structure that can electrically isolate parts of (e.g., write channel regions) two adjacent (in the X-direction) memory cells of memory device 900.

Figure 19A:
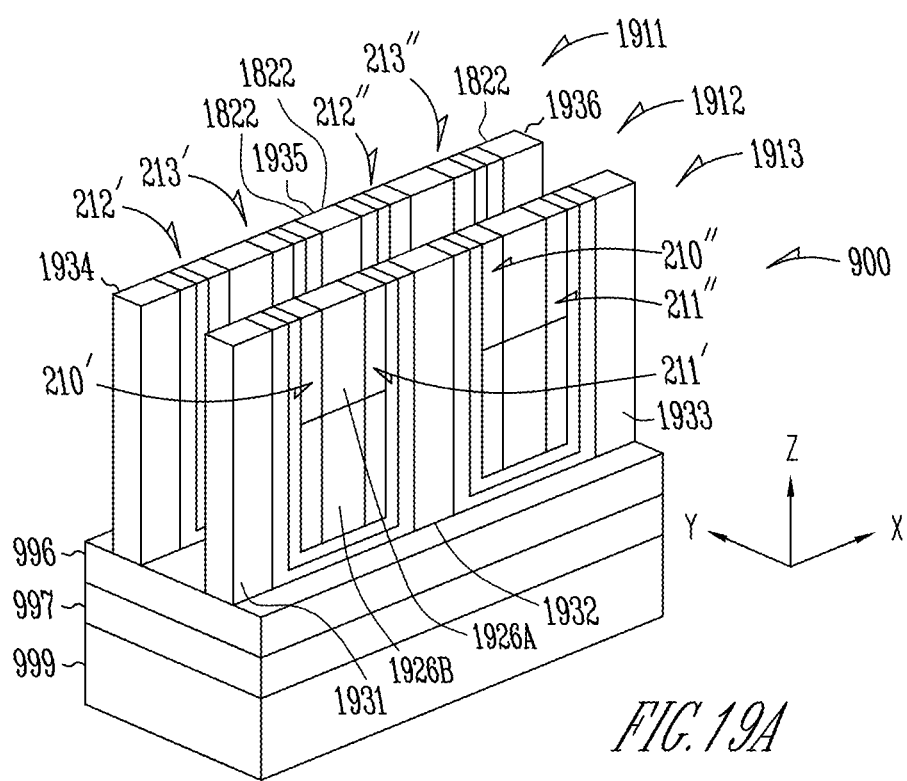

FIG. 19A shows memory device 900 after trenches 1911, 1912, and 1913 are formed (in the X-direction) across the materials of memory device 900. Each of trenches 1911, 1912, and 1913 can have a length in the X-direction, a width (shorter than the length) in the Y-direction, and a bottom (not labeled) resting on (e.g., bounded by) a respective portion of semiconductor material 996. Alternatively, each of trenches 1911, 1912, and 1913 can have a bottom (not labeled) resting on (e.g., bounded by) a respective portion of conductive material 997 (instead of semiconductor material 996). Forming trenches 1911, 1912, and 1913 can include removing (e.g., by cutting (e.g., etching) in the Z-direction) part of the materials of memory device 900 at locations of trenches 1911, 1912, and 1913 and leaving portions (e.g., slices) of the structure of memory device 900 shown in FIG. 19A.

After portions (at the locations of trenches 1911, 1912, and 1913) of memory device 900 are removed (e.g., cut), the remaining portions can form parts of memory cells of memory device 900. For example, memory device 900 can include memory cells 210', 211', 210", and 211" in one row along the X-direction, and cells 212', 213', 212", and 213" in another row along the X-direction. Memory cells 210' and 211' can correspond to memory cells 210 and 211, respectively, of memory device 200 (FIG. 2 and FIG. 7). Memory cells 212' and 213' in FIG. 19A can correspond to memory cells 212 and 213, respectively, of memory device 200 (FIG. 2).

For simplicity, only some of similar elements (e.g., portions) of memory device 900 in FIG. 19A are labeled. For example, memory device 900 can include dielectric portions (e.g., cell isolation structures) 1931, 1932, 1933, 1934, 1935, and 1936, and dielectric materials 1926A and 1926B. Dielectric portions 1931 and 1932 can correspond to two respective dielectric portions 555 of memory device 200 of FIG. 6A.

Figure 19B:
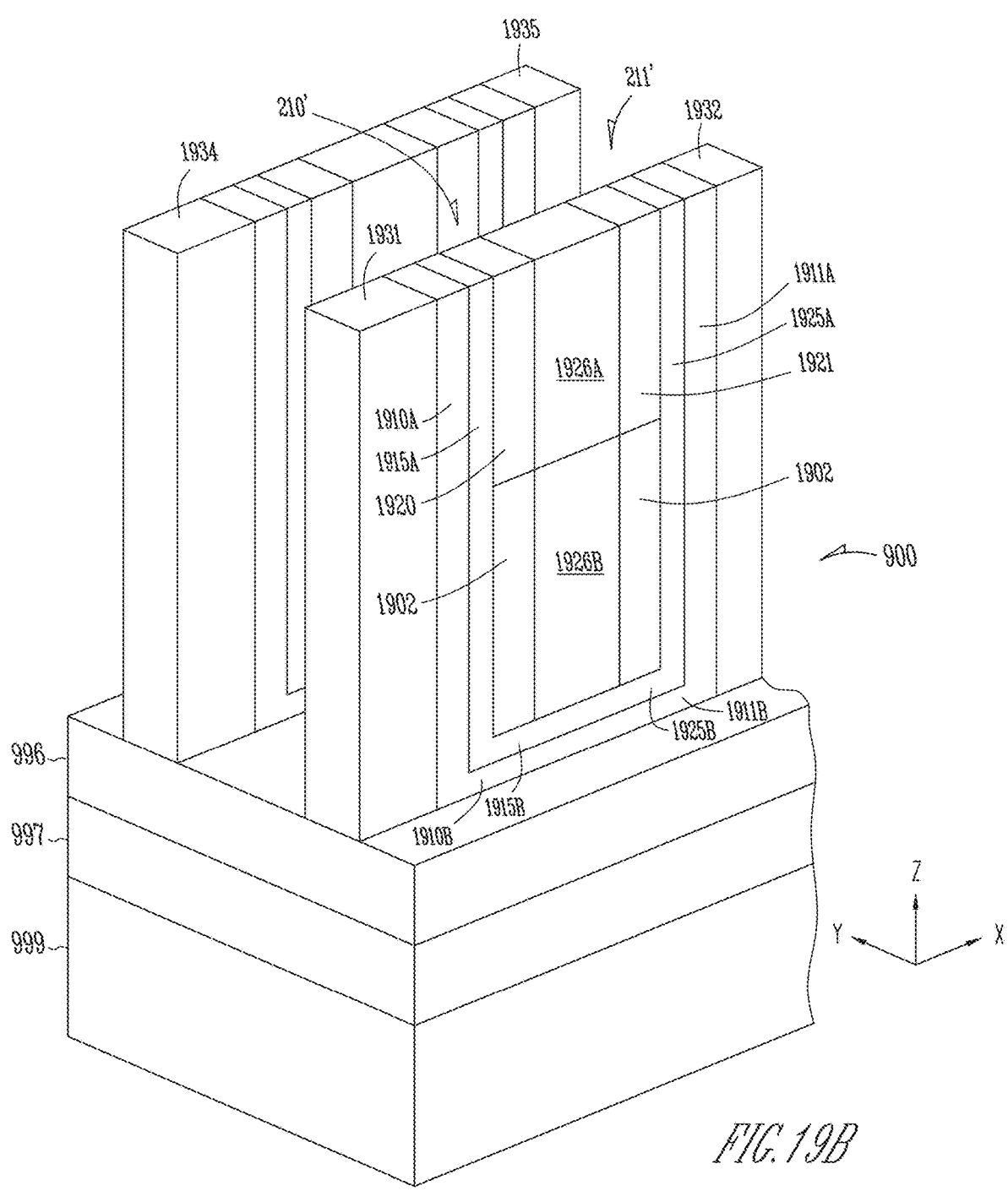
Figure 19C:
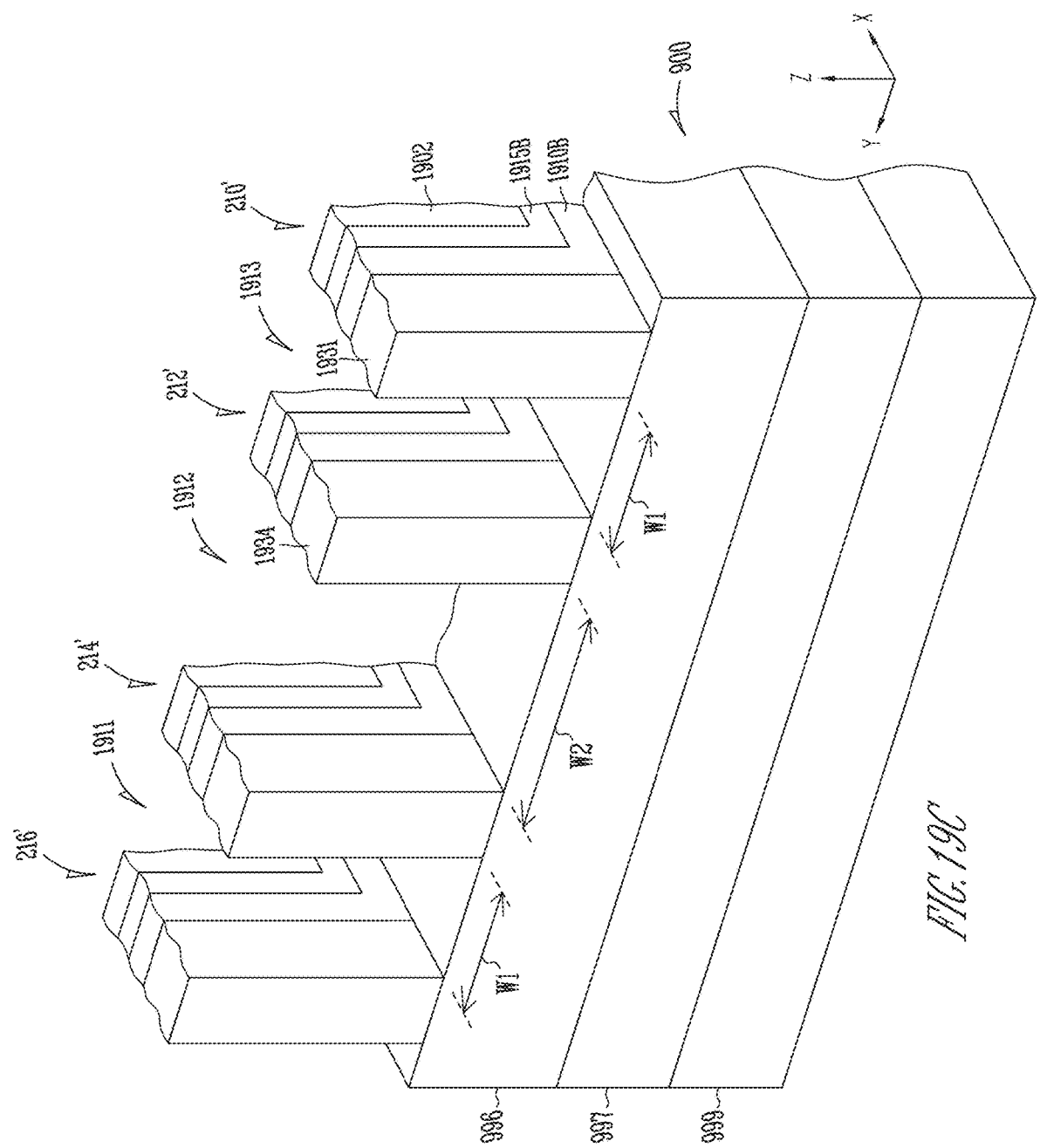

FIG. 19B shows an enlarged portion of memory device 900 of FIG. 19A. As shown in FIG. 19B, memory cell 210' can include portions 1910A and 1910B (which can be part of the read channel region of memory cell 210'), dielectric materials 1915A and 1915B, material (e.g., write channel region) 1920, and charge storage structure 1902 (directly below material 1920). Memory cell 211' can include portions 1911A and 1911B (which can be part of the read channel region of memory cell 211'), dielectric materials 1925A and 1925B, material (e.g., write channel region) 1921, and charge storage structure 1902 (directly below material 1921).

As described above with reference to FIG. 9 through FIG. 19C, part of each of the memory cells of memory device 900 can be formed from a self-aligned process, which can include formation of trenches 1001 and 1002 (FIG. 10A) in the Y-direction and trenches 1911, 1912, and 1913 (FIG. 19A) in the X-direction. The self-aligned process can improve (e.g., increase) memory cell density, improve process (e.g., provide a higher process margin), or both.

Figure 20:
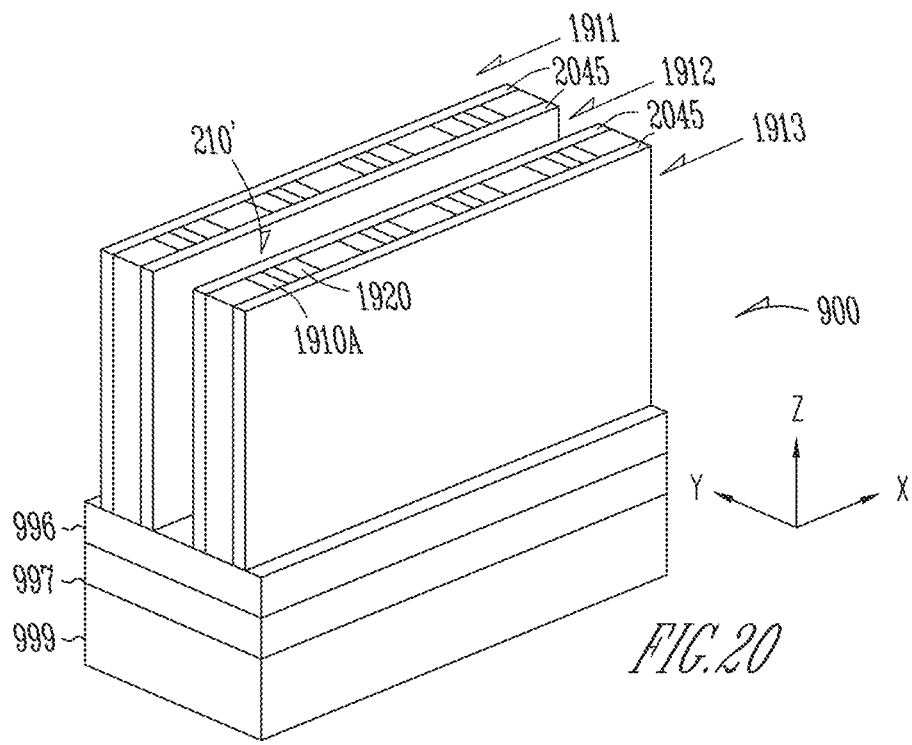

FIG. 20 shows memory device 900 after dielectrics 2045 (e.g., oxide regions) are formed. Dielectrics 2045 can be concurrently formed (e.g., formed from the same process step and the same material). The material (or materials) for dielectrics 2045 can be the same as (or alternatively, different from) the material (or materials) of dielectric materials 515A, 515B, 525A, and 525B (FIG. 6A). Example materials for dielectrics 2045 can include silicon dioxide, hafnium oxide (e.g., $HfO_2$), aluminum oxide (e.g., $Al_2O_3$), or other dielectric materials.

Figure 21:
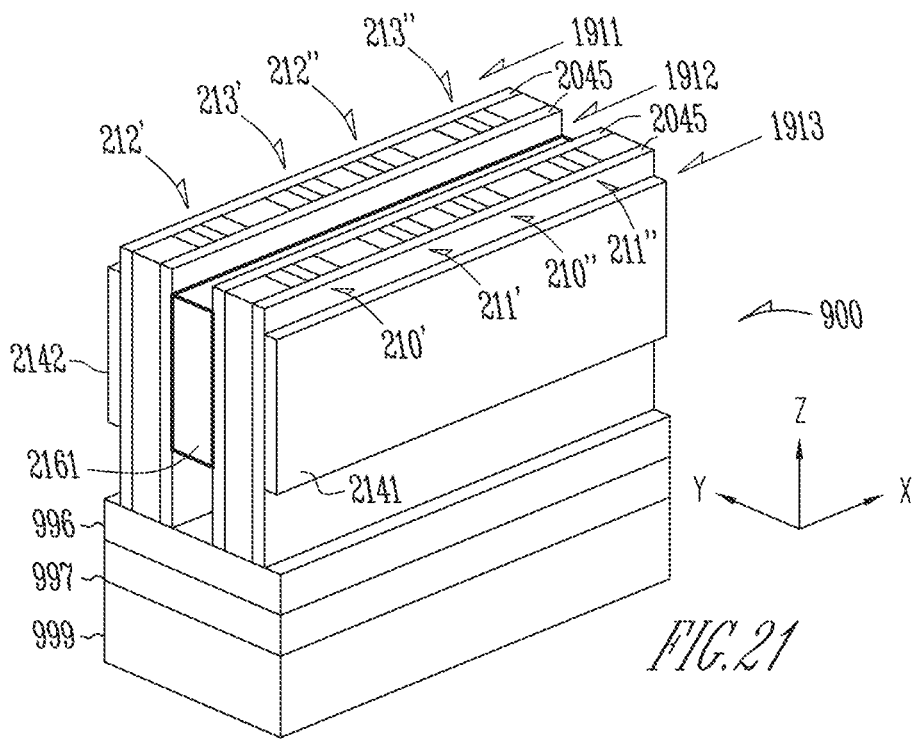

FIG. 21 shows memory device 900 after access lines 2141 and 2142 and conductive shield structure 2161 are formed. Access lines 2141 and 2142 and conductive shield structure 2161 can be concurrently formed (e.g., formed from the same process step and the same material). As shown in FIG. 21, each of dielectric materials 2045 can be between respective memory cells and either an access line (e.g., access line 2141 or 2142) or a conductive shield structure (e.g., conductive shield structure 2161). Each of access lines 2141 and 2142 and conductive shield structure 261 can contact a respective dielectric material 2045.

Access lines 2141 and 2412 can correspond to access lines 214 and 242, respectively, of memory device 200 (FIG. 2 through FIG. 6D). Conductive shield structure 2161 can correspond to conductive shield structure 261 memory device 200 (FIG. 2 through FIG. 6D). The processes associated with FIG. 21 can form other access lines and conductive shield structures of memory device 900 similar to or the same as the access lines and conductive shield structures of memory device 200 described above with reference to FIG. 2 to FIG. 6D.

In FIG. 21, each of access lines 2141 and 2142 and conductive shield structure 2161 can include metal, conductively doped polysilicon, or other conductive materials. As shown in FIG. 21, access lines 2141 and 2142 and conductive shield structure 2161 are electrically separated from memory cells 210', 211', 210", 211", 212', 213', 212", and 213" by respective dielectric materials 2045.

Access line 2141 can be structured as a conductive line (e.g., conductive region) that can be used to control the read and write transistors (e.g., transistor T1 and T2, respectively) of respective memory cells 210', 211', 210", and 211". Access line 2142 can be structured as a conductive line (e.g., conductive region) that can be used to control the read and write transistors (e.g., transistor T1 and T2, respectively) of respective memory cells 212', 213', 212", and 213".

Conductive shield structure 2161 is neither an access line (e.g., word line) of memory cells 210', 211', 210", and 211" nor an access line (e.g., word line) of memory cells 212', 213', 212", and 213". Conductive shield structure 2161 can correspond to (operate in ways similar to) conductive shield structure 261 memory device 200 (FIG. 2 through FIG. 6D).

Figure 22A:
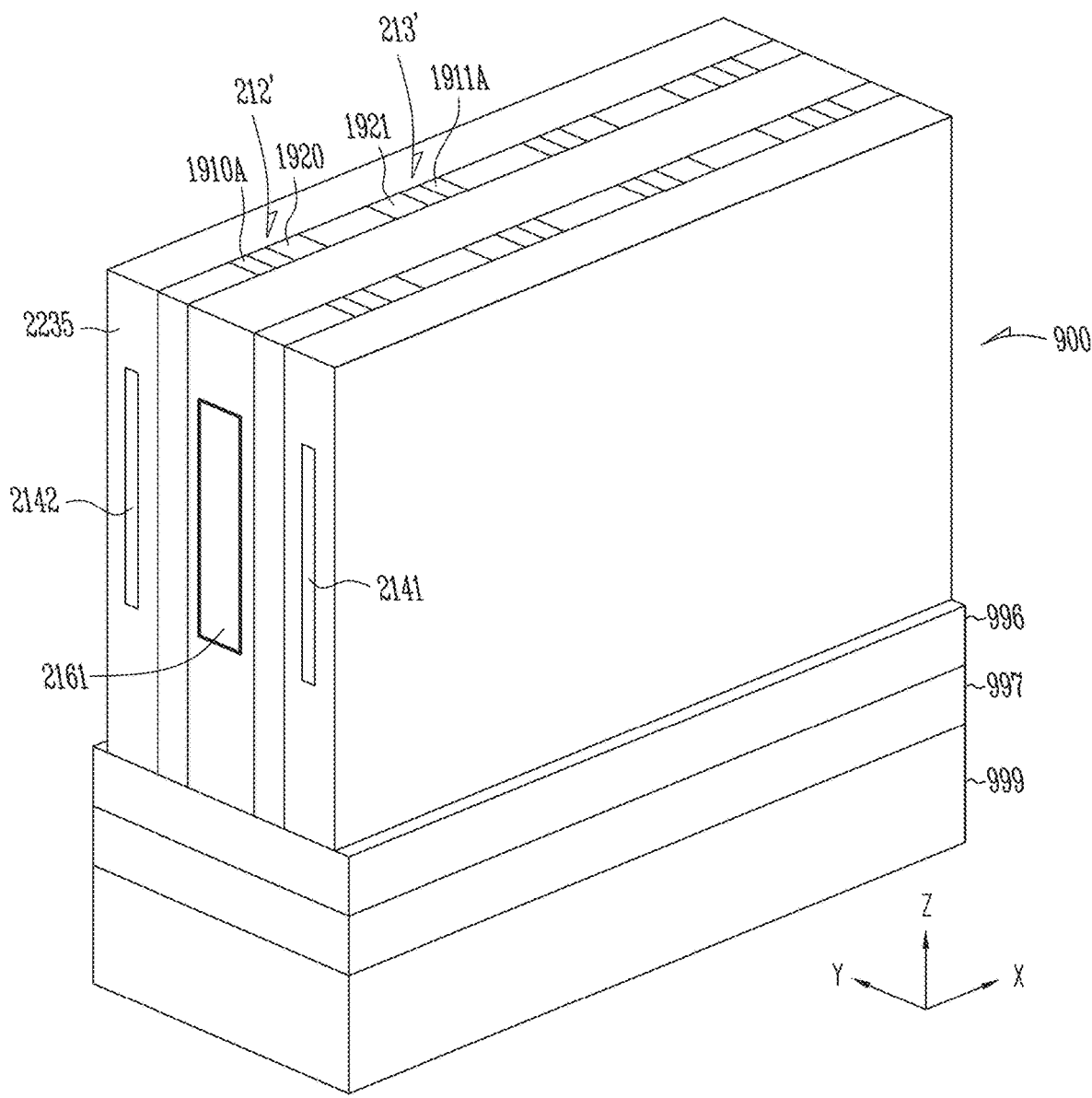

FIG. 22A shows memory device 900 after a dielectric material 2235 is formed. Dielectric material 2235 can fill the structure of memory device 900 as shown in FIG. 22A. Portion 1910A and material 1920 (e.g., read channel region and write channel region, respectively) of respective memory cells 212' and 213' are exposed. Portion 1911A and material 1921 (e.g., read channel region and write channel region, respectively) of memory cell 211' are exposed.

Figure 22B:
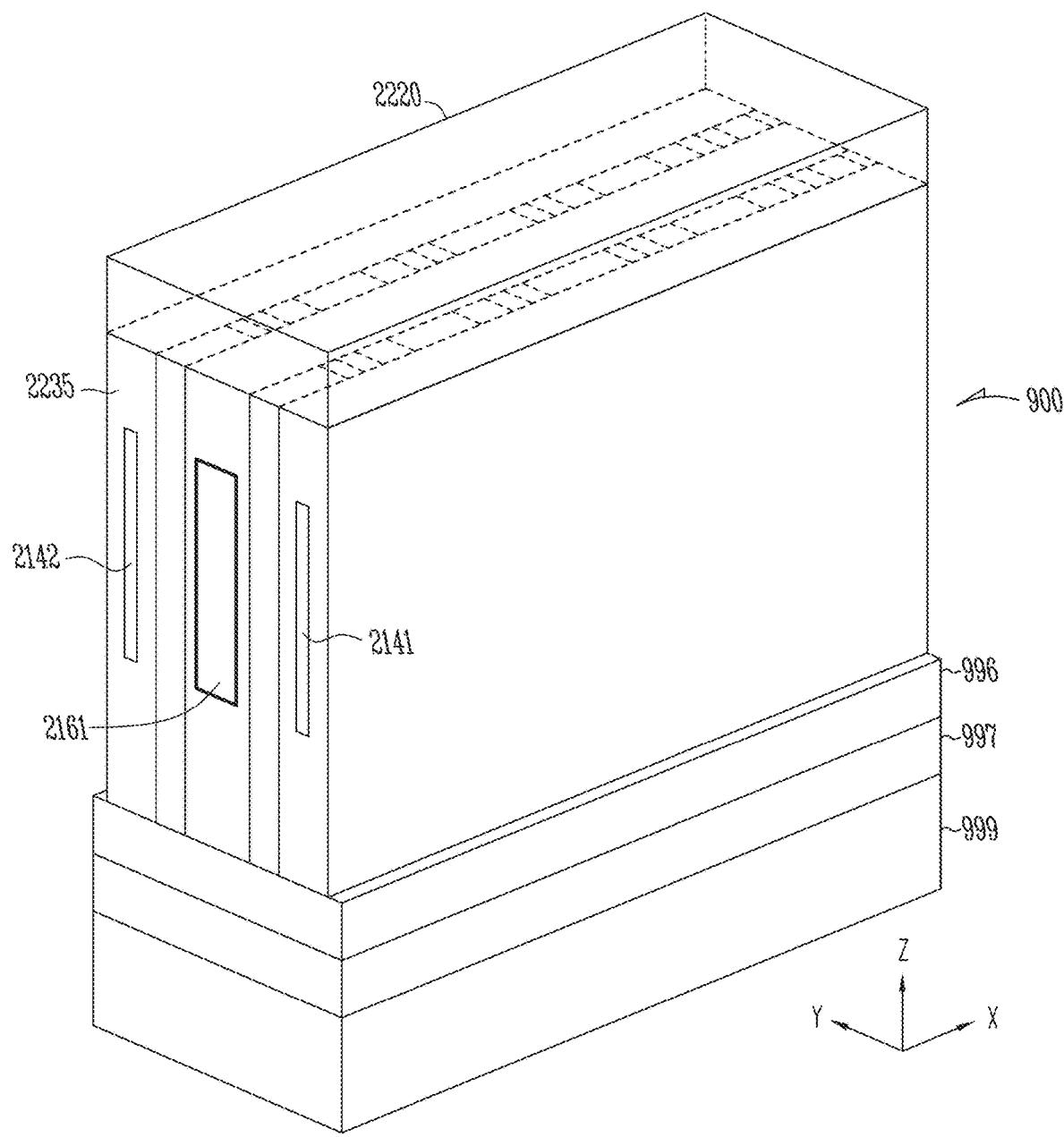

FIG. 22B shows memory device 900 after a conductive material 2220 is formed. Conductive material 2220 can be formed (e.g., deposited) over exposed portion 1910A, material 1920, portion 1911A, and material 1921 (shown in FIG. 22A) and over other elements of memory device 900.

Figure 22C:
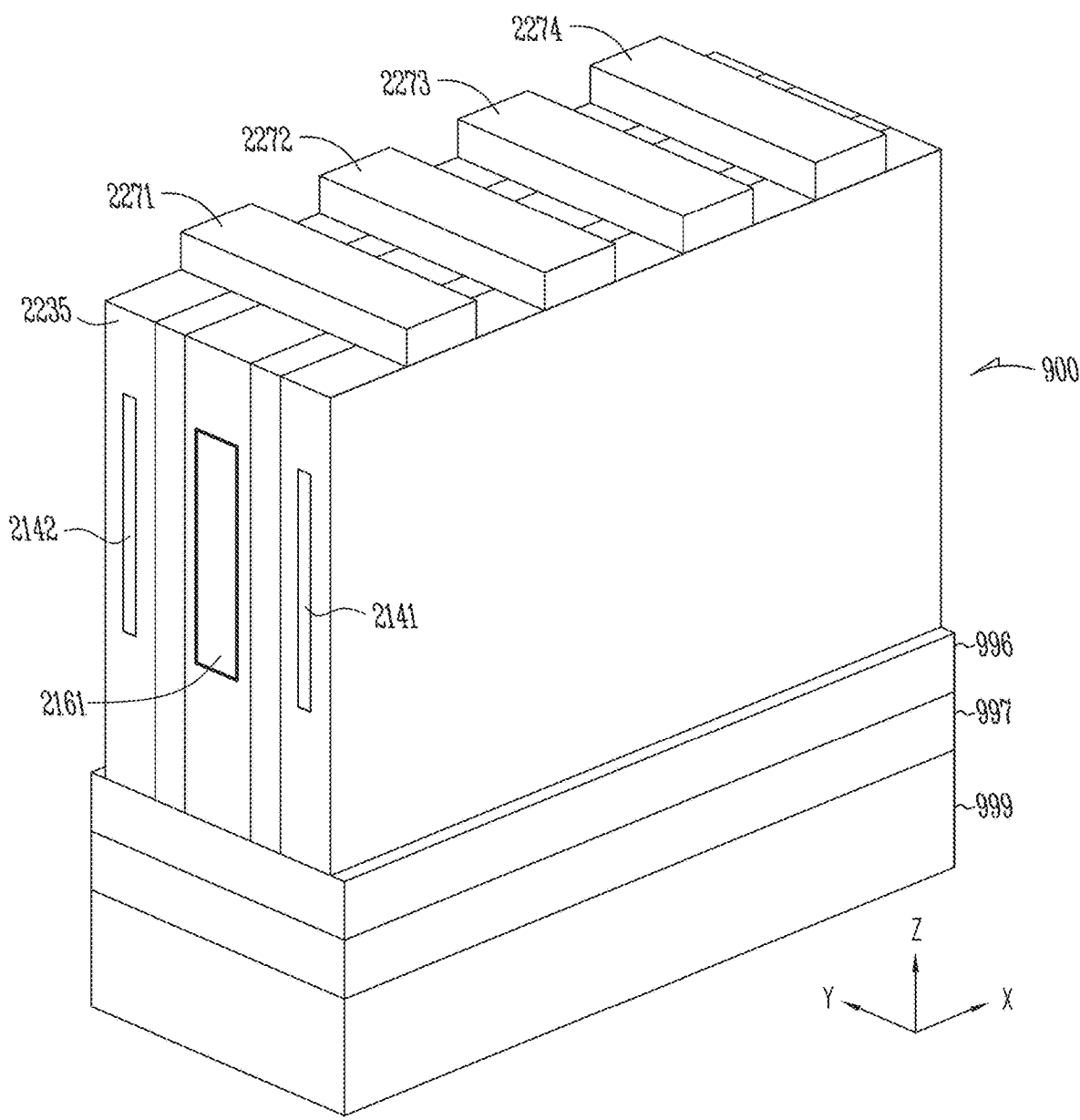

FIG. 22C shows memory device 900 after data lines 2271, 2272, 2273, and 2274 are formed. Data lines 2271, 2272, 2273, and 2274 can correspond to data lines data lines 221, 222, 223, and 224, respectively, of memory device 200 (FIG. 6A and FIG. 6C).

Data lines 2271, 2272, 2273, and 2274 can be concurrently formed. For example, a process (e.g., patterning process) can be performed to remove a portion of conductive material 2200 (FIG. 22B). In FIG. 22C, data lines 2271, 2272, 2273, and 2274 are the remaining portion of conductive material 2200.

As shown in FIG. 22C, data lines 2271, 2272, 2273, and 2274 are electrically separated from each other. Each of data lines 2271, 2272, 2273, and 2274 can have a length in the Y-direction, a width in the X-direction, and a thickness in the Z-direction.

The description of forming memory device 900 with reference to FIG. 9 through FIG. 22C can include other processes to form a complete memory device. Such processes are omitted from the above description so as to not obscure the subject matter described herein.

The process of forming memory device 900 as described above can have a relatively reduced number of masks (e.g., reduced number of critical masks) in comparison with some conventional processes. For example, by forming trenches 1001 and 1002 in the process associated with FIG. 10A, and forming trenches 1911, 1912, and 1913 in the process of FIG. 19A, the number of critical masks used to form the memory cells of memory device 900 can be reduced. The reduced number of masks can simplify the process, reduce cost, or both, of forming memory device 900. Further, the access lines (e.g., access lines 2141 and 2142) and the conductive shield structures (e.g., conductive shield structure 2161) of memory device 900 allows it to have improvements and benefits similar to those of memory device 200 (FIG. 2 through FIG. 6D).

Figure 23A:
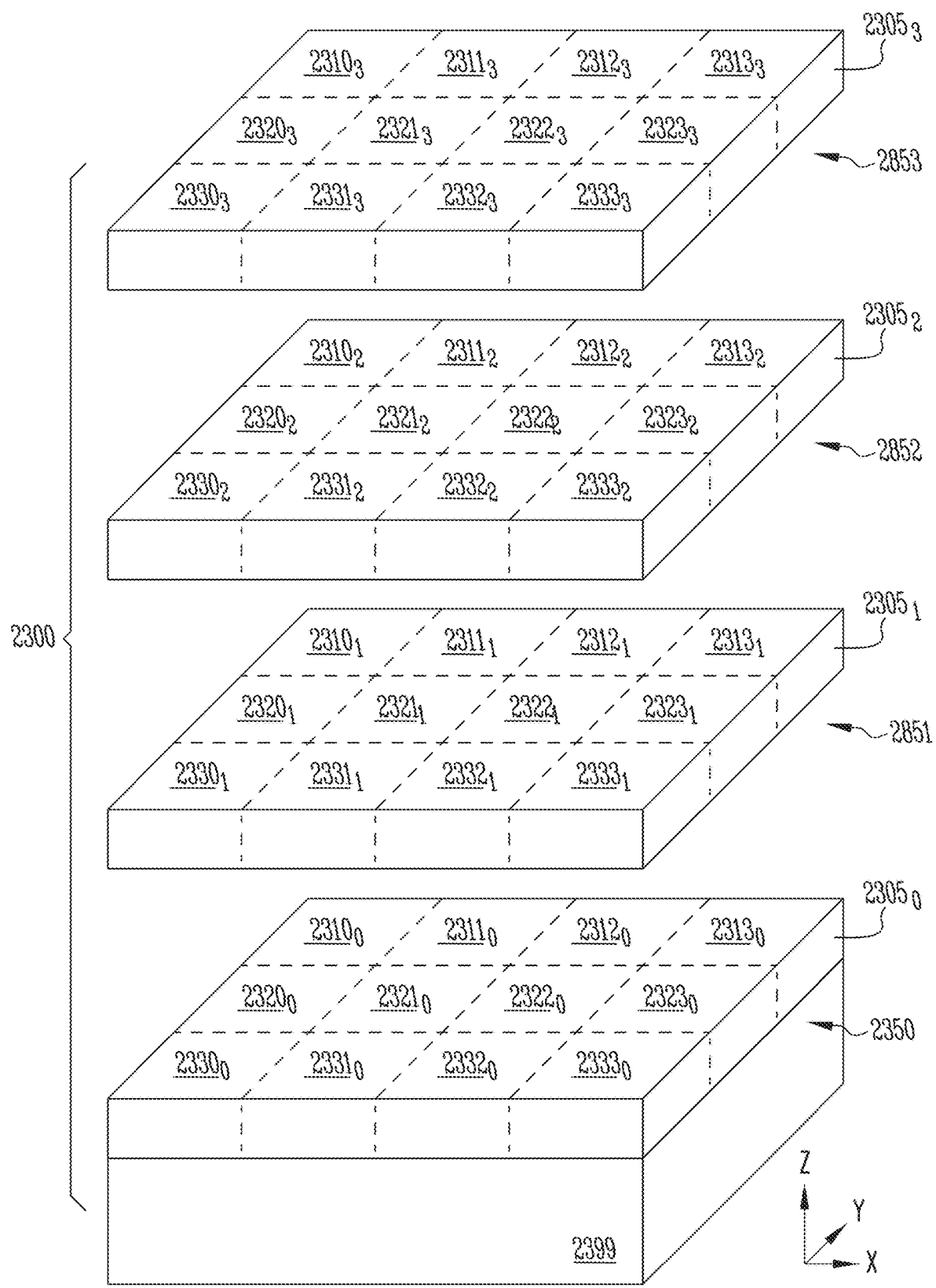
FIG. 23A, FIG. 23B, and FIG. 23C show different views of a structure of a memory device including multiple decks of memory cells, according to some embodiments described herein.
Figure 23B:
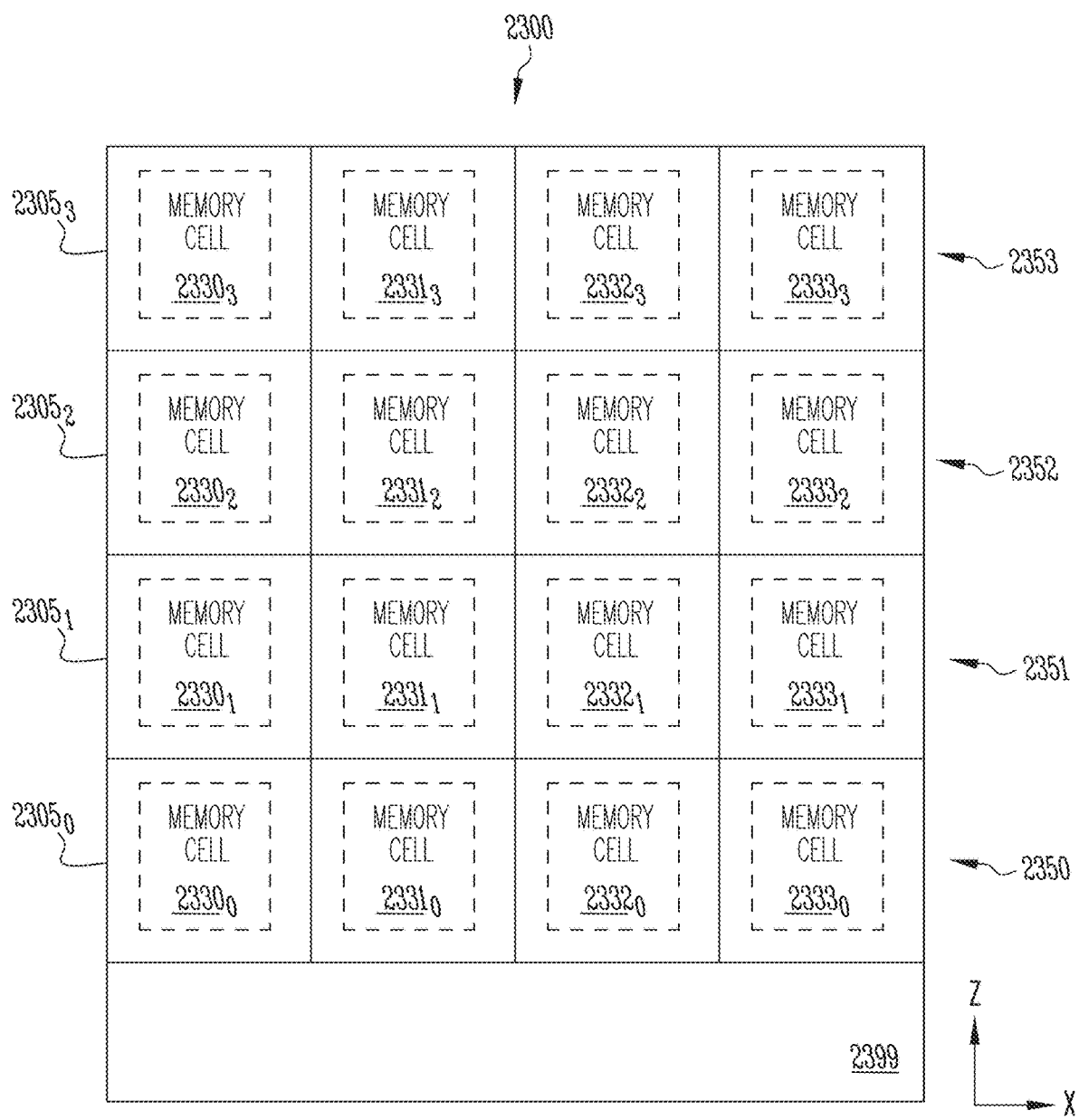
Figure 23C:
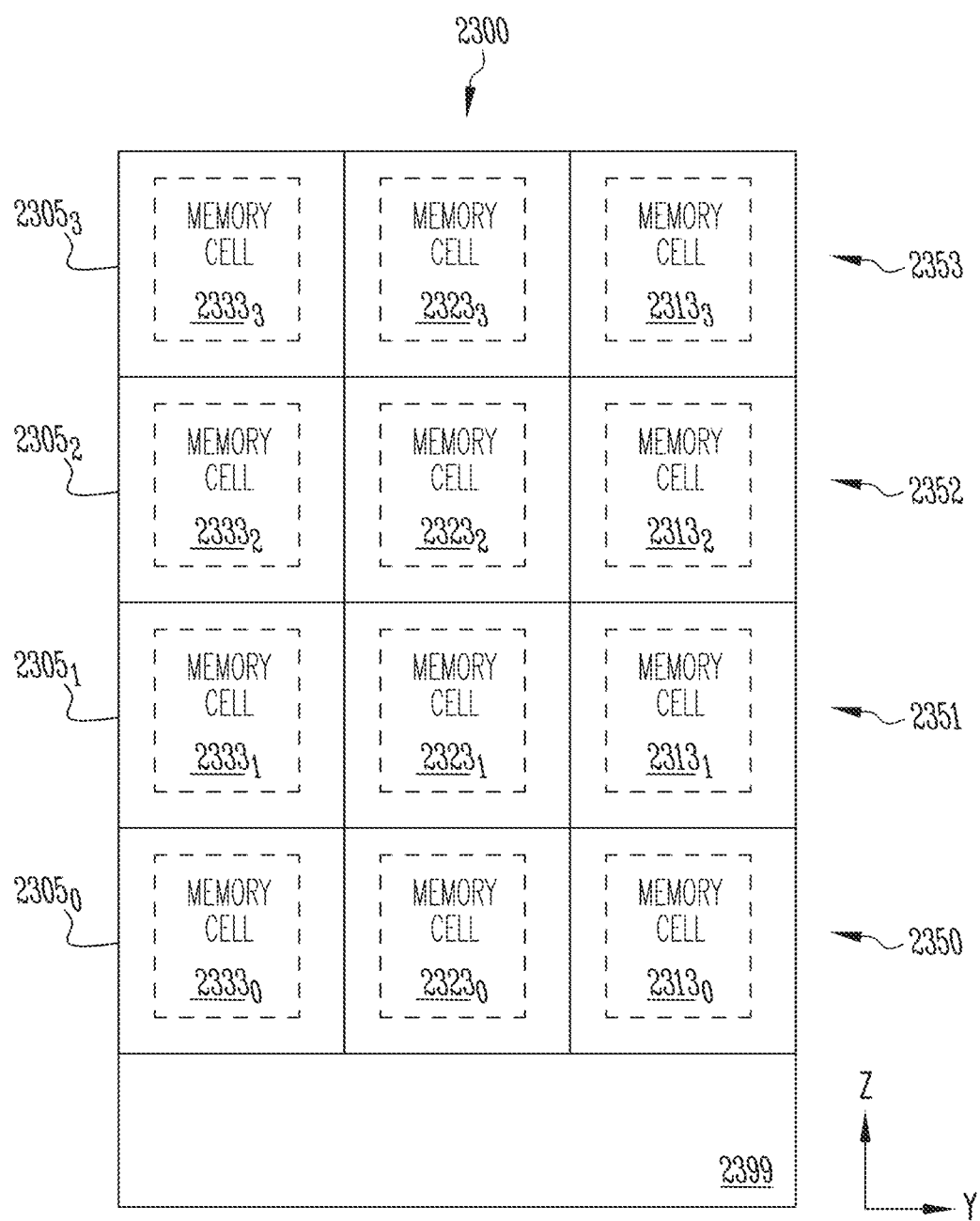

FIG. 23A. FIG. 23B, and FIG. 23C show different views of a structure of a memory device 2300 including multiple decks of memory cells, according to some embodiments described herein. FIG. 23A shows an exploded view (e.g., in the Z-direction) of memory device 2300. FIG. 23B shows a side view (e.g., cross-sectional view) in the X-direction and the Z-direction of memory device 2300. FIG. 23C shows a side view (e.g., cross-sectional view) in the Y-direction and the Z-direction of memory device 2300.

As shown in FIG. 23A, memory device 2300 can include decks (decks of memory cells) $2305_0$, $2305_1$, $2305_2$, and $2305_3$ that are shown separately from each other in an exploded view to help ease of viewing the deck structure of memory device 2300. In reality, decks $2305_0$, $2305_1$, $2305_2$, and $2305_3$ can be attached to each other in an arrangement where one deck can be formed (e.g., stacked) over another deck over a substrate (e.g., a semiconductor (e.g., silicon) substrate) 2399. For example, as shown in FIG. 23B and FIG. 23C, decks $2305_0$, $2305_1$, $2305_2$, and $2305_3$ can be formed in the Z-direction perpendicular to substrate 2399 (e.g., formed vertically in the Z-direction with respect to substrate 2399).

As shown in FIG. 23A, FIG. 23B, and FIG. 23C, each of decks $2305_0$, $2305_1$, $2305_2$, and $2305_3$ can have memory cells arranged in the X-direction and the Y-direction (e.g., arranged in rows in the X-direction and in columns in the Y-direction). For example, deck $2305_0$ can include memory cells $2310_0$, $2311_0$, $2312_0$, and $2313_0$ (e.g., arranged in a row), memory cells $2320_0$, $2321_0$, $2322_0$, and $2323_0$ (e.g., arranged in a row), and memory cells $2330_0$, $2331_0$, $2332_0$, and $2333_0$ (e.g., arranged in a row).

Deck $2305_1$ can include memory cells $2310_1$, $2311_1$, $2312_1$, and $2313_1$ (e.g., arranged in a row), memory cells $2320_1$, $2321_1$, $2322_1$, and $2323_1$ (e.g., arranged in a row), and memory cells $2330_1$, $2331_1$, $2332_1$, and $2333_1$ (e.g., arranged in a row).

Deck $2305_2$ can include memory cells $2310_2$, $2311_2$, $2312_2$, and $2313_2$ (e.g., arranged in a row), memory cells $2320_2$, $2321_2$, $2322_2$, and $2323_2$ (e.g., arranged in a row), and memory cells $2330_2$, $2331_2$, $2332_2$, and $2333_2$ (e.g., arranged in a row).

Deck $2305_3$ can include memory cells $2310_3$, $2311_3$, $2312_3$, and $2313_3$ (e.g., arranged in a row), memory cells $2320_3$, $2321_3$, $2322_3$, and $2323_3$ (e.g., arranged in a row), and memory cells $2330_3$, $2331_3$, $2332_3$, and $2333_3$ (e.g., arranged in a row).

As shown in FIG. 23A, FIG. 23B, and FIG. 23C, decks $2305_0$, $2305_1$, $2305_2$, and $2305_3$ can be located (e.g., formed vertically in the Z-direction) on levels (e.g., portions) 2350, 2351, 2352, and 2353, respectively, of memory device 2300.

The arrangement of decks $2305_0$, $2305_1$, $2305_2$, and $2305_3$ forms a 3-dimensional (3-D) structure of memory cells of memory device 2300 in that different levels of the memory cells of memory device 2300 can be located (e.g., formed) in different levels (e.g., different vertical portions) 2350, 2351, 2352, and 2353 of memory device 2300.

Decks $2305_0$, $2305_1$, $2305_2$, and $2305_3$ can be formed one deck at a time. For example, decks $2305_0$, $2305_1$, $2305_2$, and $2305_3$ can be formed sequentially in the order of decks $2305_0$, $2305_1$, $2305_2$, and $2305_3$ (e.g., deck $2305_1$ is formed first and deck $2305_3$ is formed last). In this example, the memory cell of one deck (e.g., deck $2305_1$) can be formed either after formation of the memory cells of another deck (e.g., deck $2305_0$) or before formation of the memory cells of another deck (e.g., deck $2305_2$). Alternatively, decks $2305_0$, $2305_1$, $2305_2$, and $2305_3$ can be formed concurrently (e.g., simultaneously), such that the memory cells of decks $2305_0$, $2305_1$, $2305_2$, and $2305_3$ can be concurrently formed. For example, the memory cells in levels 2350, 2351, 2352, and 2353 of memory device 2300 can be concurrently formed.

The structures decks $2305_0$, $2305_1$, $2305_2$, and $2305_3$ can include the structures of the memory devices above with reference to FIG. 1 through FIG. 22C. For example, memory device 2300 can include data lines (e.g., bit lines) and access lines (e.g., word lines) to access the memory cells of decks $2305_0$, $2305_1$, $2305_2$, and $2305_3$. For simplicity, data lines and access lines of memory cells are omitted from FIG. 23A. However, the data lines and access lines of memory device 2300 can be similar to the data lines and access lines, respectively, of the memory devices described above with reference to FIG. 1 through FIG. 22C.

FIG. 23A, FIG. 23B, and FIG. 23C show memory device 2300 including four decks (e.g., $2305_0$, $2305_1$, $2305_2$, and $2305_3$) as an example. However, the number of decks can be different from four. FIG. 23A shows each of decks $2305_0$, $2305_1$, $2305_2$, and $2305_3$ including one level (e.g., layer) of memory cells as an example. However, at least one of the decks (e.g., one or more of decks $2305_0$, $2305_1$, $2305_2$, and $2305_3$) can have two (or more) levels of memory cells. FIG. 23A shows an example where each of decks $2305_0$, $2305_1$, $2305_2$, and $2305_3$ includes four memory cells (e.g., in a row) in the X-direction and three memory cells (e.g., in a column) in the Y-direction. However, the number of memory cells in a row, in a column, or both, can vary. Since memory device 2300 can include the structures of memory devices 200, 200E, 700, 800, and 900, memory device 2300 can also have improvements and benefits like memory devices 200, 200E, 700, 800, and 900.

The illustrations of apparatuses (e.g., memory devices 100, 200, 200E, 700, 800, 900, and 2300) and methods (e.g., methods of forming memory device 900) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 200E, 700, 800, 900, and 2300) or a system (e.g., an electronic item that can include any of memory devices 100, 200, 200E, 700, 800, 900, and 2300).

Any of the components described above with reference to FIG. 1 through FIG. 23C can be implemented in a number of ways, including simulation via software. Thus, apparatuses (e.g., memory devices 100, 200, 200E, 700, 800, 900, and 2300) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 200E, 700, 800, 900, and 2300) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group. Audio Layer 3) players), vehicles, medical devices (e.g., heart monitor, blood pressure monitor, etc.), set top boxes, and others.

The embodiments described above with reference to FIG. 1 through FIG. 23C include apparatuses and methods of forming and operating the apparatuses. One of the apparatuses includes a first memory cell including a first transistor including a first channel region and a first charge storage structure and a second transistor including a second channel region formed over the charge storage structure; a second memory cell adjacent the first memory cell, the second memory cell including a third transistor including a third channel region and a second charge storage structure, and a fourth transistor including a fourth channel region formed over the second charge storage structure; a first access line adjacent a side of the first memory cell; a second access line adjacent a side of the second memory cell; a first dielectric material adjacent the first channel region; a second dielectric material adjacent the third channel region; and a conductive structure between the first and second dielectric materials and adjacent the first and second dielectric materials. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A.

B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A. B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first memory cell including a first transistor and a second transistor, the first transistor including a first channel region and a first charge storage structure separated from the first channel region, and the second transistor including a second channel region formed over the charge storage structure;
a second memory cell adjacent the first memory cell, the second memory cell including a third transistor and a fourth transistor, the third transistor including a third channel region and a second charge storage structure separated from the third channel region, and the fourth transistor including a fourth channel region formed over the second charge storage structure;
a first access line adjacent a side of the first memory cell;
a second access line adjacent a side of the second memory cell;
a first dielectric material adjacent the first channel region;
a second dielectric material adjacent the third channel region; and
a conductive structure between the first and second dielectric materials and adjacent the first and second dielectric materials, wherein the conductive structure is electrically separated from the first access line.

2. The apparatus of claim 1, wherein the first channel region and the second channel region have different conductivity types.

3. The apparatus of claim 1, wherein the second channel region includes semiconducting oxide material.

4. The apparatus of claim 1, wherein:
each of the first and second access lines and the conductive structure has a height in a direction perpendicular to a direction from the first memory cell to the second memory cell; and
the height of the conductive structure is the same as the height of each of the first and second access lines.

5. The apparatus of claim 1, wherein:
each of the first and second access lines and the conductive structure has a thickness in a direction parallel to a direction from the first memory cell to the second memory cell; and
the thickness of the conductive structure is the same as the thickness of each of the first and second access lines.

6. The apparatus of claim 1, wherein:
each of the first and second access lines and the conductive structure has a thickness in a direction parallel to a direction from the first memory cell to the second memory cell; and
the thickness of the conductive structure is greater than the thickness of each of the first and second access lines.

7. The apparatus of claim 1, wherein the second channel region includes at least one of zinc tin oxide (ZTO), indium zinc oxide (IZO), zinc oxide (ZnOx), indium gallium zinc oxide (IGZO), indium gallium silicon oxide (IGSO), indium oxide (InO$_x$, In$_2$O$_3$), tin oxide (SnO$_2$), titanium oxide (TiOx), zinc oxide nitride (Zn$_x$O$_y$N$_z$), magnesium zinc oxide (Mg$_x$Zn$_y$O$_z$), indium zinc oxide (In$_x$Zn$_y$O$_z$), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indiumzinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

8. An apparatus comprising:
a first memory cell including a first transistor and a second transistor, the first transistor including a first channel region and a first charge storage structure separated from the first channel region, and the second transistor including a second channel region formed over the charge storage structure;
a second memory cell adjacent the first memory cell, the second memory cell including a third transistor and a fourth transistor, the third transistor including a third channel region and a second charge storage structure separated from the third channel region, and the fourth transistor including a fourth channel region formed over the second charge storage structure;
a first access line adjacent a side of the first memory cell;
a second access line adjacent a side of the second memory cell;
a first dielectric material adjacent the first channel region;
a second dielectric material adjacent the third channel region; and
a conductive structure between the first and second dielectric materials and adjacent the first and second dielectric materials, wherein:
each of the first and second access lines and the conductive structure has a height in a direction perpendicular to a direction from the first memory cell to the second memory cell; and
the height of the conductive structure is unequal to the height of each of the first and second access lines.

9. An apparatus comprising:
a first trench, a second trench, and a third trench, the second trench being between the first and third trenches;
a first memory cell between the first and second trenches, the first memory cell including a first side and a second side opposite from the first side, a first transistor including a first channel region and a first charge storage structure separated from the first channel region, and a second transistor including a second channel region formed over the charge storage structure;

a second memory cell between the second and third trenches, the second memory cell including a first side and a second side opposite from the first side, a third transistor including a third channel region and a second charge storage structure separated from the third channel region, and a fourth transistor including a fourth channel region formed over the second charge storage structure;

a first access line in the second trench and adjacent the second side of the first memory cell;

a second access line in the second trench and adjacent the first side of the second memory cell;

a first conductive shield structure adjacent the first side of the first memory cell, wherein the first conductive shield is electrically separated from the first access line; and a second conductive shield structure adjacent the second side of the second memory cell, wherein the second conductive shield is electrically separated from the second access line.

10. The apparatus of claim 9, wherein the apparatus comprises a memory device having memory cells and access lines for the memory cells, wherein:

the first and second memory cells are included in the memory cells;

the first and second access lines are included in the access lines; and each of the first and third trenches void of an access line among the access lines.

11. The apparatus of claim 9, wherein the first, second, and third trenches have a same width in a direction parallel to a direction from the first memory cell to the second memory cell.

12. The apparatus of claim 9, wherein:

each of the first, second, and third trenches have a width in a direction parallel to a direction from the first memory cell to the second memory cell; and the width of the second trench is greater than the width of each of the first and third trenches.

13. An apparatus comprising:

a first trench, a second trench, and a third trench, the second trench being between the first and third trenches;

a first memory cell between the first and second trenches, the first memory cell including a first side and a second side opposite from the first side, a first transistor including a first channel region and a first charge storage structure separated from the first channel region, and a second transistor including a second channel region formed over the charge storage structure;

a second memory cell between the second and third trenches, the second memory cell including a first side and a second side opposite from the first side, a third transistor including a third channel region and a second charge storage structure separated from the third channel region, and a fourth transistor including a fourth channel region formed over the second charge storage structure;

a first access line in the second trench and adjacent the second side of the first memory cell;

a second access line in the second trench and adjacent the first side of the second memory cell;

a first conductive shield structure adjacent the first side of the first memory cell; and a second conductive shield structure adjacent the second side of the second memory cell, wherein:

each of the first and second access lines and the conductive shield structure has a thickness in a direction parallel to a direction from the first memory cell to the second memory cell; and the thickness of the conductive shield structure is greater than the thickness of each of the first and second access lines.

14. An apparatus comprising:

a first trench, a second trench, and a third trench, the second trench being between the first and third trenches;

a first memory cell between the first and second trenches, the first memory cell including a first side and a second side opposite from the first side, a first transistor including a first channel region and a first charge storage structure separated from the first channel region, and a second transistor including a second channel region formed over the charge storage structure;

a second memory cell between the second and third trenches, the second memory cell including a first side and a second side opposite from the first side, a third transistor including a third channel region and a second charge storage structure separated from the third channel region, and a fourth transistor including a fourth channel region formed over the second charge storage structure;

a first access line in the second trench and adjacent the second side of the first memory cell;

a second access line in the second trench and adjacent the first side of the second memory cell;

a first conductive shield structure adjacent the first side of the first memory cell; and a second conductive shield structure adjacent the second side of the second memory cell, wherein:

each of the first and second access lines and the conductive shield structure has a height in a direction perpendicular to a direction from the first memory cell to the second memory cell; and the height of the conductive shield structure is greater than the height of each of the first and second access line.

* * * * *